US010707856B2

(12) United States Patent
Brugger et al.

(10) Patent No.: US 10,707,856 B2
(45) Date of Patent: Jul. 7, 2020

(54) MOS POWER TRANSISTORS IN PARALLEL CHANNEL CONFIGURATION

(71) Applicant: Infineon Technologies AG, Neubiberg (DE)

(72) Inventors: Florian Brugger, Villach (AT); Christian Djelassi-Tscheck, Villach (AT); Alexander Mayer, Treffen (AT)

(73) Assignee: Infineon Technologies AG, Neubiberg (DE)

( * ) Notice: Subject to any disclaimer, the term of this patent is extended or adjusted under 35 U.S.C. 154(b) by 304 days.

(21) Appl. No.: 15/708,839

(22) Filed: Sep. 19, 2017

(65) Prior Publication Data
US 2019/0089343 A1 Mar. 21, 2019

(51) Int. Cl.
| H03K 17/00 | (2006.01) |
| H03K 17/082 | (2006.01) |
| H03K 17/12 | (2006.01) |
| H03K 17/0812 | (2006.01) |
| H02H 3/087 | (2006.01) |
| H02H 1/00 | (2006.01) |
| H02H 3/05 | (2006.01) |

(52) U.S. Cl.
CPC ....... *H03K 17/0822* (2013.01); *H02H 1/0007* (2013.01); *H02H 3/087* (2013.01); *H03K 17/08122* (2013.01); *H03K 17/122* (2013.01); *H02H 3/05* (2013.01)

(58) Field of Classification Search
CPC ......... H03K 17/0822; H03K 17/08122; H03K 17/122; H02H 1/0007; H02H 3/087; H02H 3/05
See application file for complete search history.

(56) References Cited

U.S. PATENT DOCUMENTS

| 5,793,127 | A  | * | 8/1998 | Qualich  | H03K 17/0822 307/116 |
| 8,421,509 | B1 | * | 4/2013 | Chen | H03L 7/0893 327/148 |
| 10,122,280 | B1 | * | 11/2018 | Vaananen | H02M 3/156 |
| 2006/0034138 | A1 | * | 2/2006 | Bolz | H03K 17/0822 365/202 |
| 2017/0308112 | A1 | * | 10/2017 | Reichelt | G05F 3/262 |

* cited by examiner

*Primary Examiner* — Pete T Lee
(74) *Attorney, Agent, or Firm* — Shumaker & Sieffert, P.A.

(57) ABSTRACT

A circuit comprises a first metal-oxide semiconductor, MOS, power transistor having a first gate terminal, a first drain terminal, and a first source terminal, a second MOS power transistor having a second gate terminal, a second drain terminal, and a second source terminal, and a switch connected in-between the first gate terminal and the second gate terminal and configured to selectively couple the first gate terminal and the second gate terminal.

20 Claims, 13 Drawing Sheets

1001
Selectively coupling a first gate
terminal of a first MOS power transistor
and a second gate terminal
of a second MOS power transistor

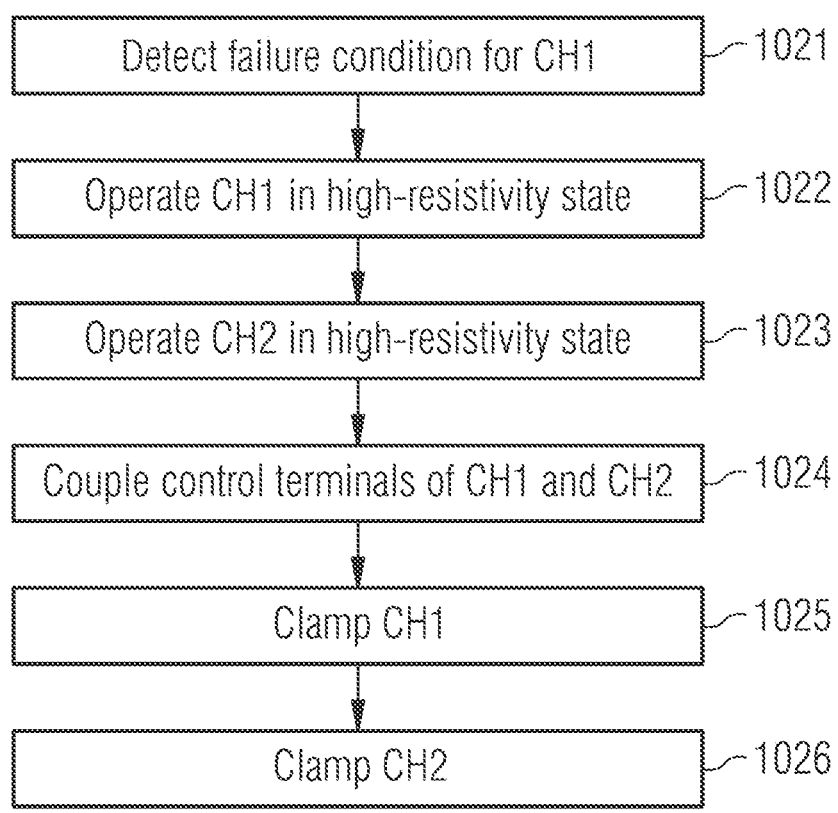

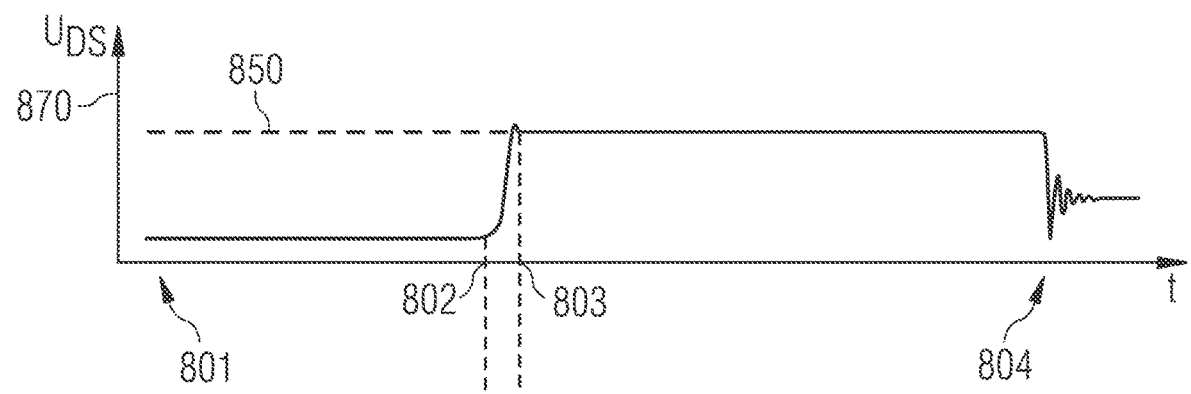
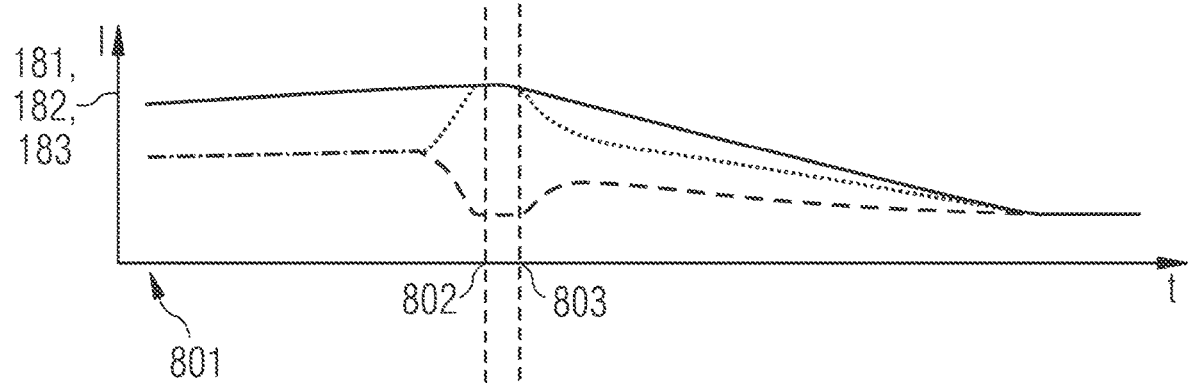
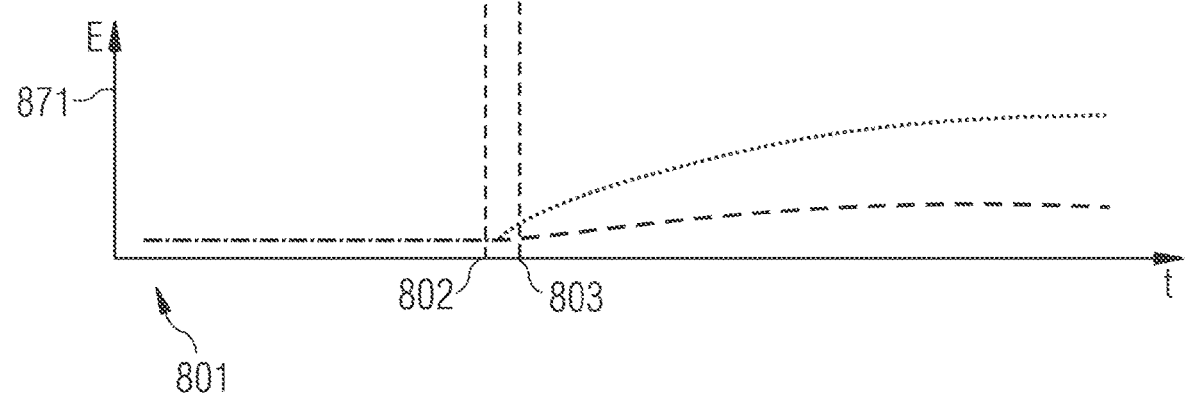

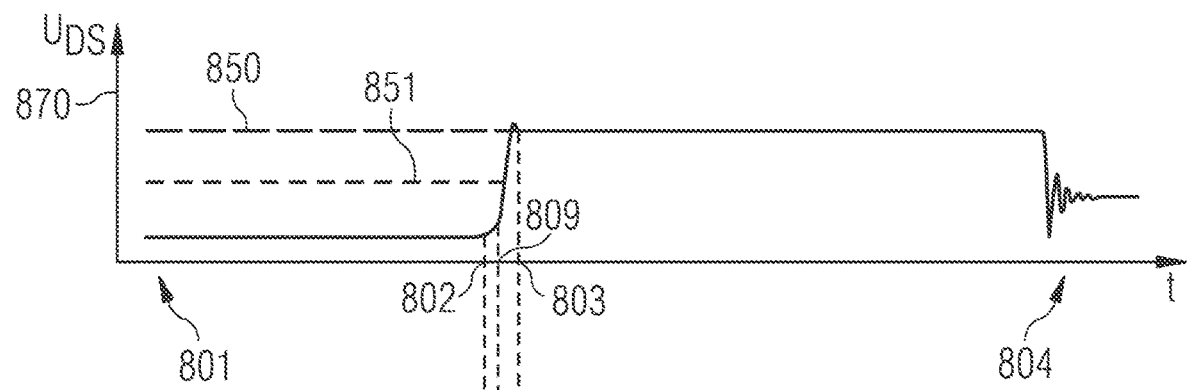
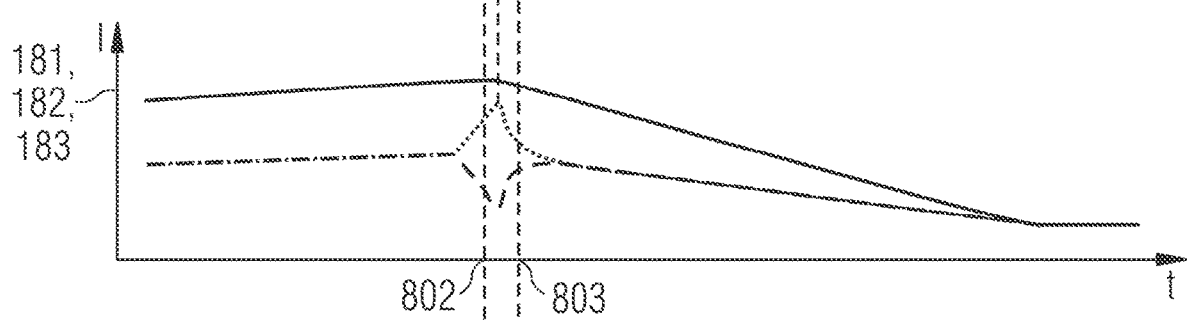
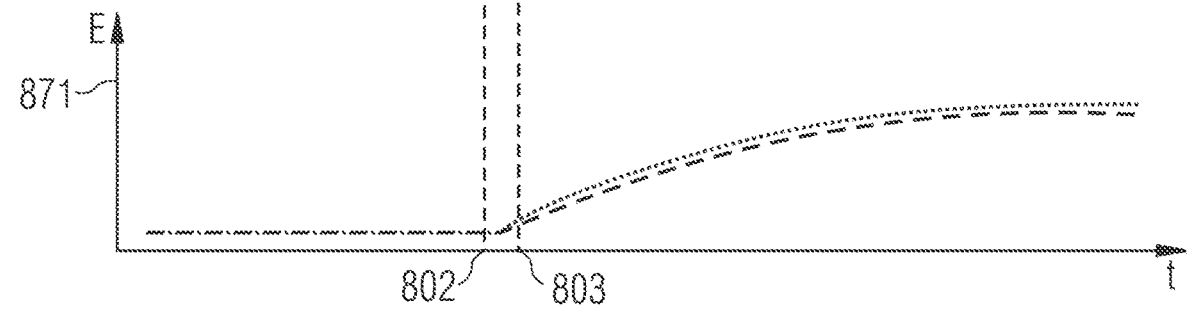

MOS POWER TRANSISTORS IN PARALLEL CHANNEL CONFIGURATION

TECHNICAL FIELD

Various examples relate to a circuit comprising multiple metal-oxide semiconductor power transistors. Various examples specifically relate to a switch connected in-between gate terminals of the multiple metal-oxide semiconductor power transistors.

BACKGROUND

Power switches are conventionally used to selectively couple a load with a supply voltage. In recent years, "smart" power switch devices have been developed which are equipped with one or more diagnostic abilities and protection features, for example against failure conditions such as overload and short circuit. For example, in such power switch devices a MOS power transistor may be used as switching element. The MOS power transistor may be operated in a defined state, e.g., high-resistivity state, in case of a failure condition.

Certain applications require driving higher loads and/or reducing power losses. To achieve such goals, it is possible to implement a plurality of MOS power transistors in the circuit and provide the circuit with the ability to support a parallel channel configuration: here, the load is connected in series to the plurality of MOS power transistors and the MOS power transistors are connected in parallel. In the parallel channel configuration, in the low-resistivity state of the power switch, the current through each MOS power transistor of the plurality of MOS power transistors is reduced; thereby, the overall current drawn by the load—corresponding to the sum of currents through the plurality of MOS power transistors—can be increased. A smaller current through an individual power transistor also reduces the dissipated power of that power transistor.

It has been observed that protecting the MOS power transistors against failure conditions can be difficult in such a parallel channel configuration.

SUMMARY

A circuit includes a first MOS power transistor. The first MOS power transistor has a first gate terminal, a first drain terminal, and a first source terminal. The circuit further includes a second MOS power transistor. The second MOS power transistor has a second gate terminal, a second drain terminal, and a second source terminal. The circuit further includes a switch which is connected in-between the first gate terminal and the second gate terminal. The switch is configured to selectively couple the first gate terminal and the second gate terminal.

A circuit includes a first MOS power transistor. The first MOS power transistor has a first gate terminal, a first drain terminal, and a first source terminal. The circuit further includes a second MOS power transistor. The second MOS power transistor has a second gate terminal, a second drain terminal, and a second source terminal. The circuit further includes a control circuitry which is configured to detect a failure condition of at least one of the first MOS power transistor and the second MOS power transistor. The control circuitry is configured to provide a first control signal to the first gate terminal to operate the first MOS power transistor in a high-resistivity state and to provide a second control signal to the second gate terminal to operate the second MOS power transistor in a high-resistivity state, in response to said detecting of the failure condition. If parasitic line inductances are present, a clamping phase is preceding the high-resistive state.

A method includes detecting a failure condition of at least one of at least two MOS power transistors. The method further includes, in response to said detecting the failure condition: synchronizing the gate terminals of the at least two MOS power transistors.

It is to be understood that the features mentioned above and those yet to be explained below may be used not only in the respective combinations indicated, but also in other combinations or in isolation without departing from the scope of the invention.

BRIEF DESCRIPTION OF THE DRAWINGS

FIG. 7 is a flowchart of a method according to various examples.

FIG. 8 schematically illustrates the time evolution of the voltage across a MOS power transistor according to various examples.

FIG. 9 schematically illustrates the time evolution of currents through MOS power transistors according to various examples.

FIG. 10 schematically illustrates the integrated dissipated energy for MOS power transistors according to various examples.

FIG. 11 schematically illustrates the time evolution of the voltage across a MOS power transistor according to various examples.

FIG. 12 schematically illustrates a time evolution of currents through MOS power transistors according to various examples.

FIG. 13 schematically illustrates the integrated dissipated energy for MOS power transistors according to various examples.

DETAILED DESCRIPTION OF EMBODIMENTS

Figure 1:
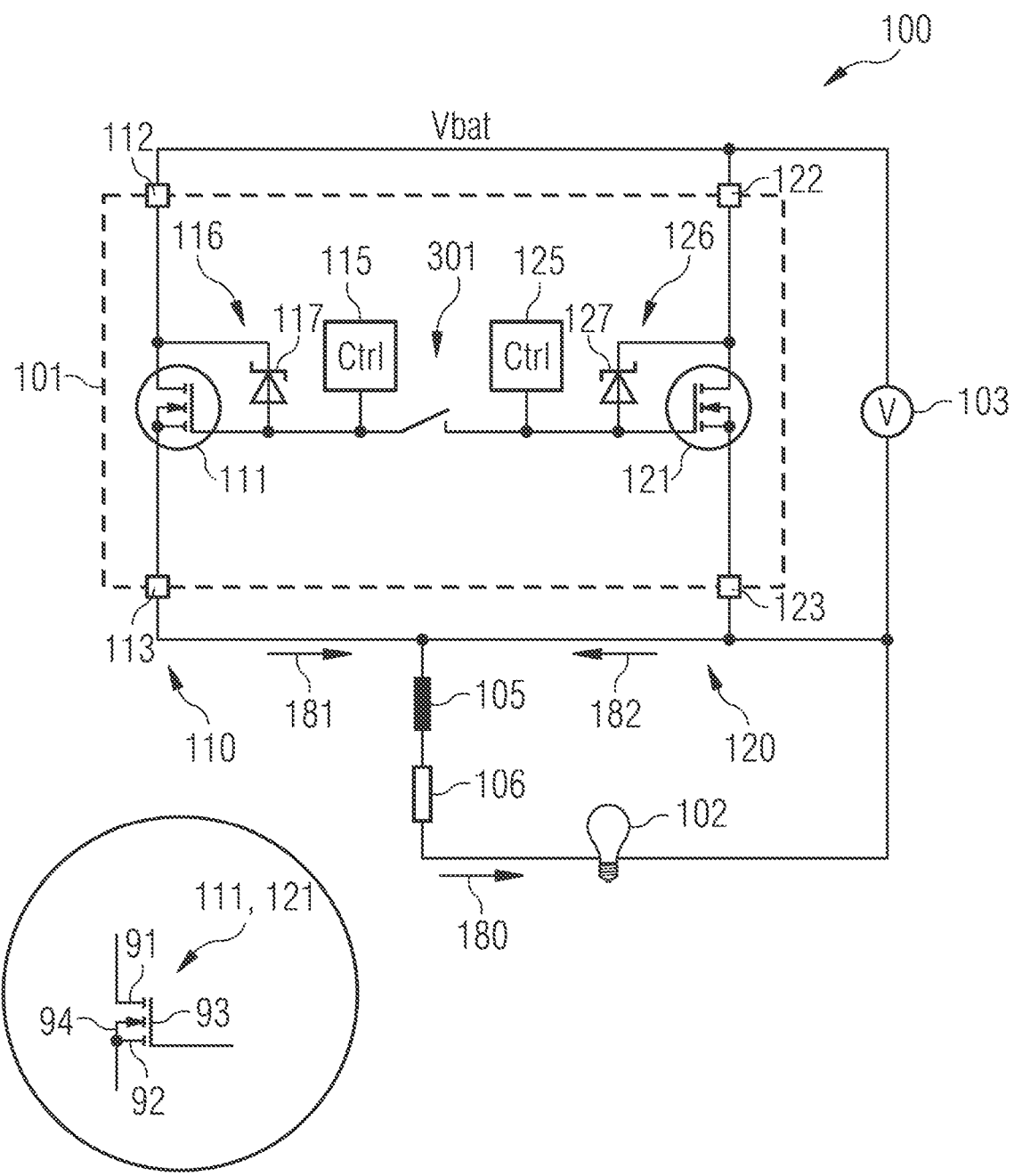
FIG. 1 schematically illustrates a system according to various examples, wherein the system includes a circuit having a first MOS power transistor and a second MOS power transistor and wherein the system further includes a load connected to the source terminals of, both, the first MOS power transistor and the second MOS power transistor in a parallel channel configuration.

In the following, embodiments of the invention will be described in detail with reference to the accompanying drawings. It is to be understood that the following description of embodiments is not to be taken in a limiting sense. The scope of the invention is not intended to be limited by the embodiments described hereinafter or by the drawings, which are taken to be illustrative only.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Hereinafter, techniques with respect to MOS power transistors are described. For example, the MOS power transistors may be implemented as field-effect transistors (FETs). For example, it would be possible that the MOS power transistors described herein are implemented as double-diffused MOSFETs. The MOS power transistors can be implemented using a vertical source-drain channel or a horizontal source-drain channel. A gate terminal may be insulated using poly-oxide or oxide. The MOS power transistors may each have an active area of not less than 0.15 mm$^2$, optionally of not less than 0.25 mm$^2$. Such techniques facilitate switching of comparably high currents by operating the MOS power transistors in a high-resistivity state and a low-resistivity state, respectively. The channel resistance between the source terminal and the drain terminal may vary by orders of magnitude, depending on whether the MOS power transistor is operated in the high-resistivity state or the low-resistivity state. The MOS power transistors are typically designed to have a comparably low resistivity in the low-resistivity state. Thereby, losses when operating the MOS power transistors in the low-resistivity state can be reduced. Sometimes, the high-resistivity state is referred to as OFF state, while the low-resistivity state is referred to as ON state. For example, currents of up to 5 A or even 50 A may be switched. The MOS power transistors may be integrated on a die or chip. It is possible that the MOS power transistors occupy at least 5%, or optionally at least 10%, or optionally at least 50% of the active chip area. Typically, if higher currents are to be switched, the chip area covered by the MOS power transistors also increases.

Generally, the MOS power transistors may include a gate terminal and a drain terminal and a source terminal. A load current through the MOS power transistor flows between the drain terminal and the source terminal, if the MOS power transistors operated in the low-resistivity state. In a stable condition, there is no or no significant load current between the drain terminal and the source terminal, if the MOS power transistor is operated in the high-resistivity state. By providing an appropriate control signal to the gate terminal, the MOS power transistor can be selectively operated in the low-resistivity state of the high-resistivity state.

During emergency shutdown of the MOS power transistors—e.g., in response to detecting a failure condition—and prior to reaching the stable condition, it is possible that a significant discharge currents flows through the MOS power transistors even if they are operated in the high-resistivity state. These inductive discharge currents, also referred to as inductive commutation currents result from parasitic wire inductances.

The techniques described herein facilitate a parallel channel configuration of multiple MOS power transistors. In particular, the techniques described herein facilitate the parallel channel configuration by providing protection of the MOS power transistors against failure conditions. Damage to the MOS power transistors in case of a failure condition may be avoided.

In particular, protection against a wide variety of failure conditions may be provided. Example failure conditions include overcurrent through the MOS power transistors—e.g., due to a shorted load—, over-temperature, a spatial and/or temporal temperature gradient exceeding a threshold (differential temperature), overvoltage, etc.

Various techniques are based on the finding that, in case of a failure condition, clamps associated with different MOS power transistors of different channels may have deviating operational characteristics. In particular, a clamp voltage may be different for different clamps. This may be due to different breakthrough voltages of Zener diodes employed for implementing the clamps. Then, if the clamp voltages are different for different MOS power transistors, a symmetry between the different MOS power transistors is lifted and the currents through the different MOS power transistors—e.g., due to discharge of inductances or capacitances—can vary. Thus, one or more MOS power transistors may be subject to increased wear out if compared to one or more further MOS power transistors.

Various further techniques are based on the finding that, in case of a failure condition, control circuitries associated with different MOS power transistors of different channels may have different response times. Hence, if an appropriate sensor detects a failure condition, the time required to change the state of operation of different MOS power transistors from low resistivity to high resistivity may vary from MOS power transistor to MOS power transistor. Again, this lifts a symmetry between the different MOS power transistors and the currents through the different MOS power transistors—e.g., the discharge currents due to discharge of inductances—can vary. Thus, one or more MOS power transistors may be subject to increased wear out if compared to one or more further MOS power transistors.

Techniques are described herein which enable to mitigate such increased wear out of MOS power transistors. This is achieved by avoiding asymmetries in the operation of the various MOS power transistors.

According to examples, a switch is connected in-between gate terminals of different MOS power transistors. The switch is configured to selectively couple the gate terminals. This helps to synchronize the gate terminals of the MOS power transistors.

Thereby, negative effects associated with different clamp voltages may be mitigated. In particular, it may be possible to selectively couple the gate terminals in response to detecting a failure condition. When the different MOS power transistors are clamped—i.e., if the clamp between the respective gate terminal and an source terminal and/or the clamp between the respective gate terminal and an drain terminal is in a low-resistivity state—, offsets in the voltage level of the various gate terminals—that would otherwise be observed due to deviations in the clamp voltages—can be avoided by coupling these gate terminals. Thereby, differences in the currents through the different MOS power transistors can be avoided. Asymmetries between the MOS power transistors are avoided by synchronizing the gate terminals of the MOS power transistors. Selective wear out is avoided.

According to examples, a control circuitry is configured to detect a failure condition of at least one of a first MOS power transistor and a second MOS power transistor. Then, in response to said detecting of the failure condition, both, the first MOS power transistor, as well as the second MOS power transistor can be operated in a high-resistivity state. Thus, the gate drivers of the gate terminals of the MOS power transistors can be synchronized.

Hence, it is possible to affect the state in which multiple MOS power transistors are operated even if a failure condition is detected only for one of the multiple MOS power transistors. This facilitates synchronized emergency shutdown of multiple MOS power transistors. Thereby, differences in the currents through the different MOS power transistors can be avoided, in particular differences in the discharge currents prior to reaching the stable state. Asymmetries between the MOS power transistors are avoided. Selective wear out is avoided.

FIG. 1 illustrates aspects with respect to a system 100. The system 100 includes a circuit 101, a load 102, and a voltage source 103 providing a supply voltage Vbat. The supply voltage Vbat may be provided by a battery. The supply voltage Vbat may drive the load 102. The circuit 101 includes a MOS power transistor 111 associated with a channel 110; and further includes a MOS power transistor 121 associated with a further channel 120.

The inset of FIG. 1 illustrates that the MOS power transistors 111, 121 each include an drain terminal 91, an source terminal 92—connected in the scenario of FIG. 1 with a body terminal 94—, as well as a gate terminal 93.

As illustrated in FIG. 1, the channel 110 includes an input pin 112 and an output pin 113. The channel 120 includes an input pin 122 and an output pin 123. The load 102 is connected to the output pins 113, 123 of both channels 110, 120. This is a parallel channel configuration. In the parallel channel configuration, the current 180 through the load 102 corresponds to the sum of the currents 181, 182 of the channels 110, 120, respectively.

Furthermore illustrated in FIG. 1 is an inductance 105 and a resistance 106. The inductance 105 and the resistance 106 can be due to parasitic effects and/or the finite length of the electric traces between the MOS power transistors 111, 121 and the load 102. Energy is stored by the inductance 105 if the current 180 flows through the inductance 105. While not illustrated in FIG. 1, it would also be possible that a capacitance—e.g., due to parasitic effects and/or the finite length of the electric traces—is observed.

In FIG. 1, the channel 110 is associated with control circuitry 115; and the channel 120 is associated with control circuitry 125. The control circuitry 115, 125 may include gate drivers configured to provide control signals to the gate terminals 93 of the MOS power transistors 111, 121. In particular, the control circuitry 115 may be operated independently of the control circuitry 125. Therefore, it is conceivable that while the MOS power transistor 111 is operated in a low-resistivity state; while, at the same time, the MOS transistor 121 is operated in a high-resistivity state. This causes an asymmetry in the currents 181, 182.

FIG. 1 also illustrates aspects of clamps 116, 126 associated with the MOS power transistors 111, 121. The clamp 116 includes a Zener diode 117 connected in reverse direction between the drain terminal 91 and the gate terminal 93; and further includes a Zener diode 118 connected in reverse direction between the gate terminal 93 and the source terminal 92 of the MOS power transistor 111. The clamp 126 associated with the MOS power transistor 121 is configured accordingly having the Zener diodes 127, 128. The clamps 116, 126 provide overvoltage protection. The voltage between the terminals 91, 92 is limited according to the clamp voltage. For example, techniques of active "Zenering" may be employed. Here, Zener diode 117 may pull up the voltage at the gate terminal 93 of the MOS power transistor 111 when being clamped. Then, the MOS power transistor 111 may be switched to allow a certain current flow.

It is possible that the clamp voltages of the clamps 116, 126 are not matched, i.e., exhibit a voltage difference of a few mV or even V. This may be due to manufacturing tolerances. Due to the un-matched clamp voltages, an asymmetry between the inductive discharge currents through the MOS power transistors 111, 121 can result. This asymmetry is, in particular, observed if a switch 301 connected in-between the gate terminals 93 of the MOS power transistors 111, 121 is operated in a high-resistivity state, as illustrated. According to various examples, the switch 301 may be operated in a low-resistivity state to mitigate such asymmetries. If the switch 301 is operated in the low-resistivity state, the gate terminals 93 of the MOS power transistors 111, 121 are coupled; while the gate terminals 93 of the MOS power transistors 111, 121 are not coupled, if the switch 301 is operated in the high-resistivity state.

In the various examples described herein, different implementations of the switch 301 may be used. For example, the switch 301 may be implemented using high-voltage (HV) FETs of n-type or p-type or both.

Figure 2:
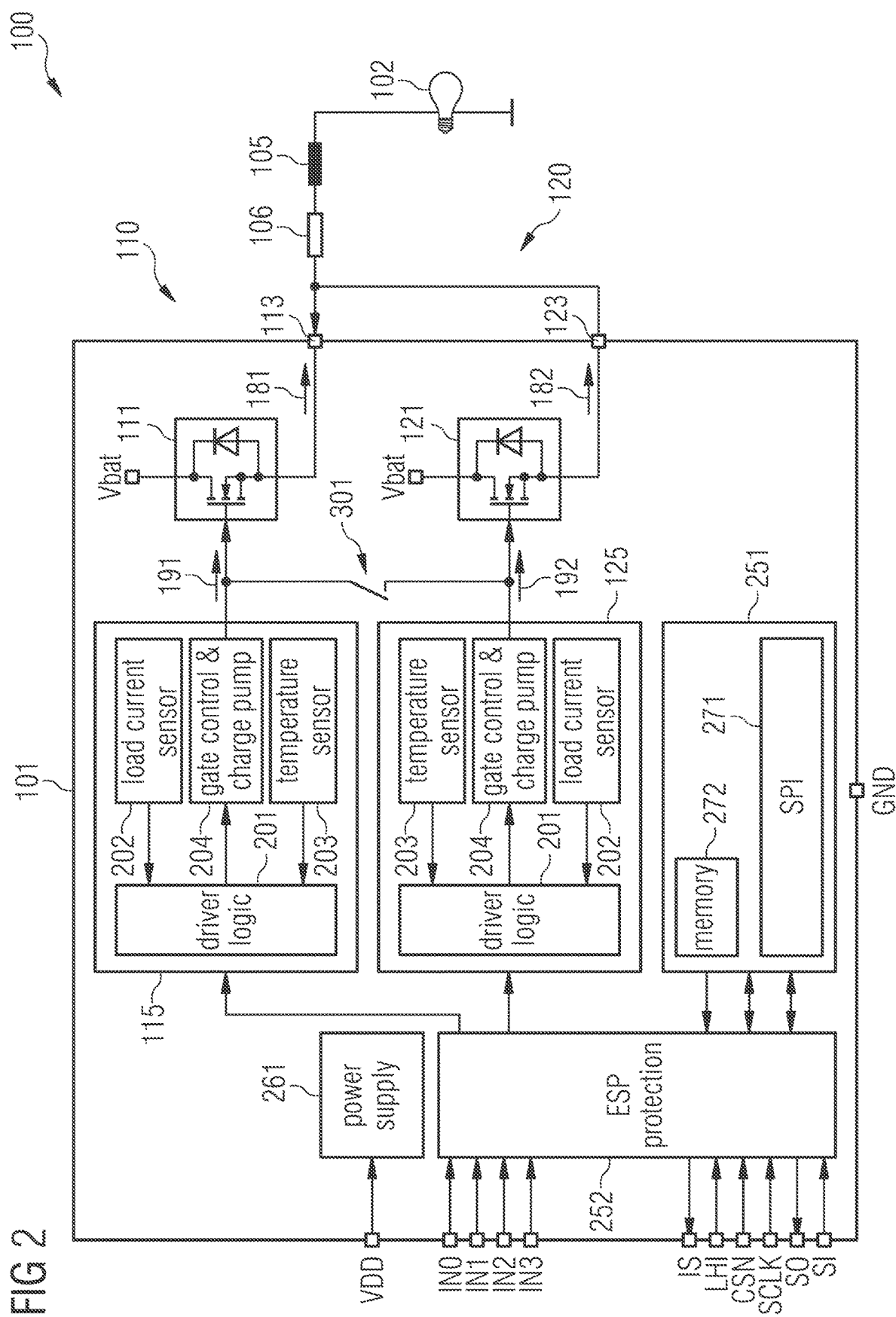
FIG. 2 schematically illustrates a circuit according to various examples.

FIG. 2 illustrates aspects with respect to the system 100. In particular, FIG. 2 illustrates aspects with respect to the control circuitries 115, 125.

The control circuitry 115 includes driver logic 201. The driver logic 201 controls a gate driver 204 including a charge pump. The gate driver 204 is configured to output a control signal to the gate terminal 93 of the MOS power transistor 111. The gate driver 204 is configured to output the control signal depending on the control provided by the driver logic 201.

The control circuitry 115 also includes a current sensor 202 and a temperature sensor 203. The current sensor 202 is configured to sense the current 181. If the current 181 exceeds a predefined threshold, the overcurrent failure condition may be signaled by an appropriate sensor signal to the driver logic 201. Then, the driver logic 201 may control the gate driver 204 to output a control signal that operates the MOS power transistor 111 in the high-resistivity state. The temperature sensor 203 is configured to monitor the temperature in the environment of the MOS power transistor 111. Alternatively or additionally, the temperature sensor 203 may be configured to monitor the temperature with respect to the environment of the MOS power transistor 111; such a failure condition may be labeled delta temperature failure condition. Here, the on-chip temperature difference may exceed a threshold. Based on this monitoring, the temperature sensor 203 is configured to signal an delta- or overtemperature failure condition to the driver logic 201. Then, the driver logic 201 may control the gate driver 204 to output a control signal that operates the MOS power transistor 111 in the high-resistivity state.

The control circuitry 125 is configured in a similar manner as the control circuitry 115.

Control signals 191, 192 provided to the gate terminals 93 by the respective control circuitries 115, 125 are also illustrated in FIG. 2.

FIG. 2 further illustrates further control circuitry 251, 252. The control circuitry 252 provides protection against electrostatic discharge. The control circuitry 251 allows configuration of an operating mode of the device 110 via a serial peripheral interface 271. A respective memory 272 is provided. Also illustrated in FIG. 2 is a power supply 261.

Figures 3, 4:
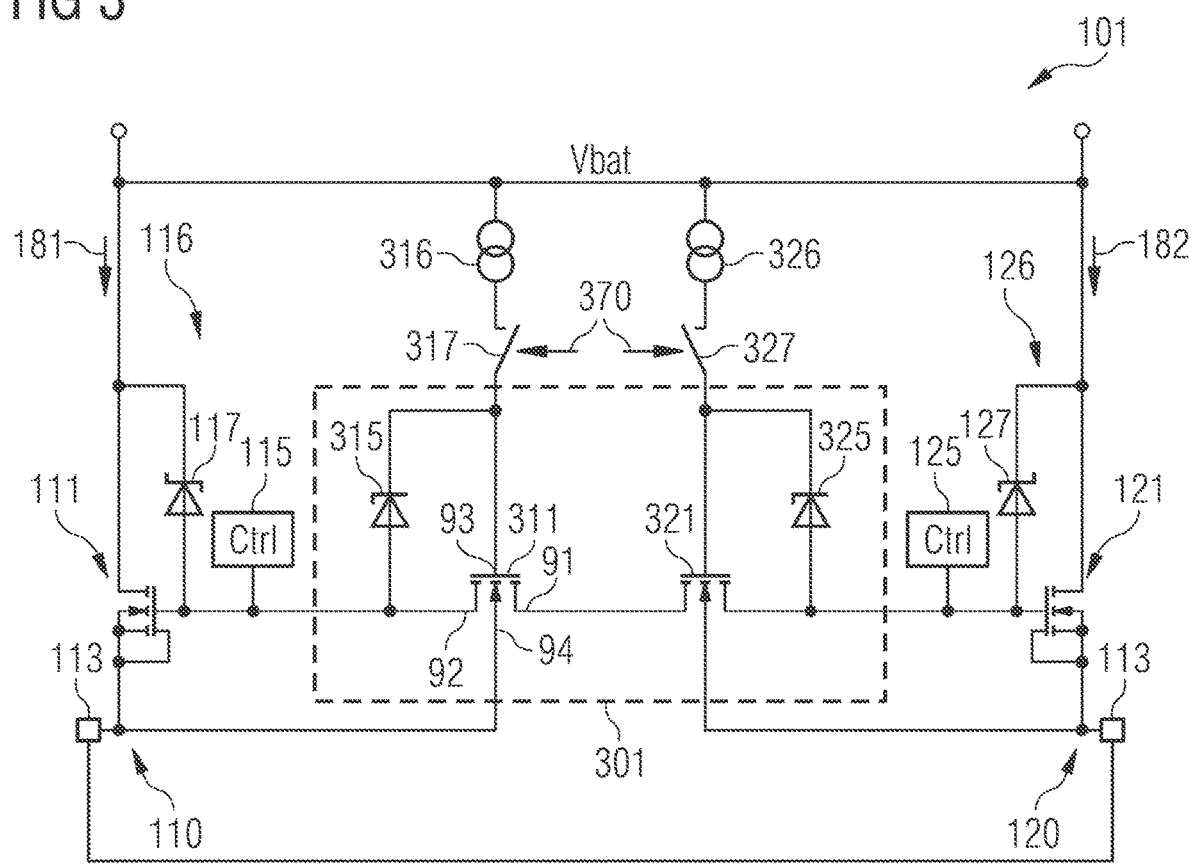
FIG. 3 schematically illustrates a switch selectively coupling a gate terminal of a first MOS power transistor and a gate terminal of a second MOS power transistor according to various examples.
FIG. 4 is a flowchart of a method according to various examples.

FIG. 3 illustrates aspects with respect to the circuit 101. FIG. 3, in particular, illustrates aspects with respect to selectively coupling gate terminals of the MOS power transistors 111, 121.

The circuit 101 includes a switch 301 connected in-between the gate terminal 93 of the MOS power transistor 111 and the gate terminal 93 of the MOS power transistor 121. The switch 301 is configured to selectively couple the gate terminals 93 of the MOS power transistors 111, 121; i.e., the switch 301 is configured to couple or to not couple the gate terminals 93, e.g., depending on certain trigger criteria.

In the scenario of FIG. 3, one such trigger criterion is the voltage difference between the gate terminals 93 of the MOS power transistors 111, 121 and the respective drain terminals 91.

In detail, as illustrated in FIG. 3, a possible implementation of the switch 301 includes MOS transistors 311, 321. The body terminal 94 of the MOS transistor 311 is coupled with the source terminal 92 of the MOS power transistor 111; while the body terminal 94 of the MOS transistor 321 is coupled with the source terminal 92 of the MOS power transistor 121. The drain terminal 91 of the MOS transistor 311 is coupled with the gate terminal 93 of the MOS power transistor 111; while the drain terminal 91 of the MOS transistor 321 is coupled with the gate terminal 93 of the MOS power transistor 121. Thereby, if a large voltage difference is present between the drain terminal 91 and the gate terminal 93 of the MOS power transistor 111, there is also the same large voltage difference present between the source terminal 92 and the gate terminal 94 of the MOS transistor 311. For example, if the voltage difference between the drain terminal 91 and the gate terminal 93 of the MOS power transistor 111 exceeds 3 V, this voltage difference may exceed the gate-source threshold voltage of the MOS transistor 311; then the MOS transistor 311 is operated in the low-resistivity state. Similar considerations also apply to the MOS transistor 321. If, both, the MOS transistor 311, as well as the MOS transistor 321 are operated in the low-resistivity state, the gate terminals 93 of the MOS power transistors 111, 121 are coupled with each other. Thus, in other words, the switch 301 is configured to selectively couple the gate terminal 93 of the MOS power transistors 111, 121 if the voltage difference between the drain terminal 91 and the gate terminal 93 of the MOS power transistor 111 exceeds a certain threshold and if the voltage difference between the drain terminal 91 and the gate terminal 93 of the MOS power transistor 121 also exceeds a certain threshold. Typically, the resistivity of the MOS transistors 311, 321 is lower than the resistivity of the clamped Zener diodes 117, 127; this facilitates synchronization of the voltage levels at the gate terminals 93 of the MOS power transistors 111, 121 by means of a current that is via the switch 301.

The MOS power transistors 111, 121 may be configured to switch larger currents, if compared to the MOS transistors 311, 321. The MOS power transistors 111, 121 may each have an active area which is larger than the active area of the MOS transistors 311, 321 at least by a factor of two, optionally at least by a factor of ten.

In FIG. 3, the Zener diodes 315, 325 are provided to limit the gate-source voltage difference of the MOS transistors 311, 321. The current sources 316, 326 are provided to charge the gate terminals 93 of the MOS transistors 311, 321.

In particular, this trigger criterion of the voltage difference between the drain terminal 91 and the gate terminal 93 exceeding a certain threshold may be met if the respective MOS power transistor 111, 121 experiences a voltage drop defined by the clamp voltage of the respective clamp 116, 126. I.e., the switch 301 may be operated in a low-resistivity state if both MOS power transistors 111, 121 are being clamped by the clamps 116, 126. This clamping of the MOS power transistors 111, 121 may, in particular, occur if the MOS power transistors 111, 121 are operated in a high-resistivity state when an emergency shutdown occurs in response to detecting a failure condition.

Thus, a further trigger criterion is operation of both MOS power transistors 111, 121 in the high-resistivity state. For example, operation of the MOS power transistors 111, 121 may, in turn, be triggered by detection of a failure condition by the respective control logic 115, 125.

Yet another trigger criterion can be implemented by means of the switches 317, 327. The switches 317, 327 are selectively operated in a low-resistivity state depending on an operating mode of the circuit 101. An operating mode control signal 370—provided by the control circuitry 115, 125—is used to control operation of the switches 317, 327 in the low-resistivity state or in the high-resistivity state, respectively. The switches 317, 327 are operated in the low-resistivity state or in the high-resistivity state in a synchronized manner, because both switches 317, 327 receive the same operating mode control signal 370.

In the scenario illustrated in FIG. 3, the switches 317, 327 are operated in the high-resistivity state. Then, the MOS transistors 311, 321 are permanently operated in a high-resistivity state. Hence, control of the switch 301 between operation in a low-resistivity state and in a high-resistivity state is permanently deactivated. For example, even if the voltage differences between the source terminals 92 and the gate terminals 93 of the MOS power transistors 111, 121 both exceed a certain threshold, still the switch 301 is in the high-resistivity state. If the switches 317, 327 are operated in a low-resistivity state, i.e., if the operating mode control signal 370 is set appropriately, then there may be gate-source voltage difference at the MOS transistors 311, 321. This is because the voltage at the gate terminals 93 of the MOS power transistors 111, 121 may then drop below the supply voltage Vbat (while during normal operation when the MOS power transistor 111, 121 is operated in the low-resistivity state, the voltage at the gate terminal 93 of the respective MOS power transistor 111, 121 is above the supply voltage Vbat, by means of a gate driver). It follows from the above that the control circuitry 115, 125 is configured to selectively activate control of the switch 301 between the low-resistivity state of the high-resistivity state based on an operating mode of the circuit 101.

For example, it would be possible that the operating mode is indicated by a command received via the serial peripheral interface 271 and/or a value stored in the memory 272. For example, it would be possible that the operating mode is indicative of whether a parallel channel configuration—as illustrated in FIG. 3 by the connection of the output pins 113, 123—is used. Thus, the operating mode may be indicative of the parallel channel configuration.

Illustrated in FIG. 3 is a scenario where the MOS transistors 311, 321, as well as the MOS power transistors 111, 121 are all n-type. This facilitates integration of the transistors 311, 321, 111, 121 on a common substrate. Furthermore, a comparably simple technology may be used for manufacturing FIG. 4 is a flowchart of a method according to various examples. In block 1001, a first gate terminal of the first MOS power transistor and a second gate terminal of a second MOS power transistor are selectively coupled.

For example, the selectively coupling may depend on one or more trigger criteria such as an operating mode of the corresponding device, and/or a voltage difference across the first and/or a second MOS power transistors. A further trigger criterion may be detection of a failure condition and/or a respective emergency shutdown. A further trigger criterion may be the first and/or second MOS power transistors being clamped.

For example, the method according to the flowchart of FIG. 4 it could be implemented by the circuit 101 as discussed above with respect to FIG. 3.

Figure 5:
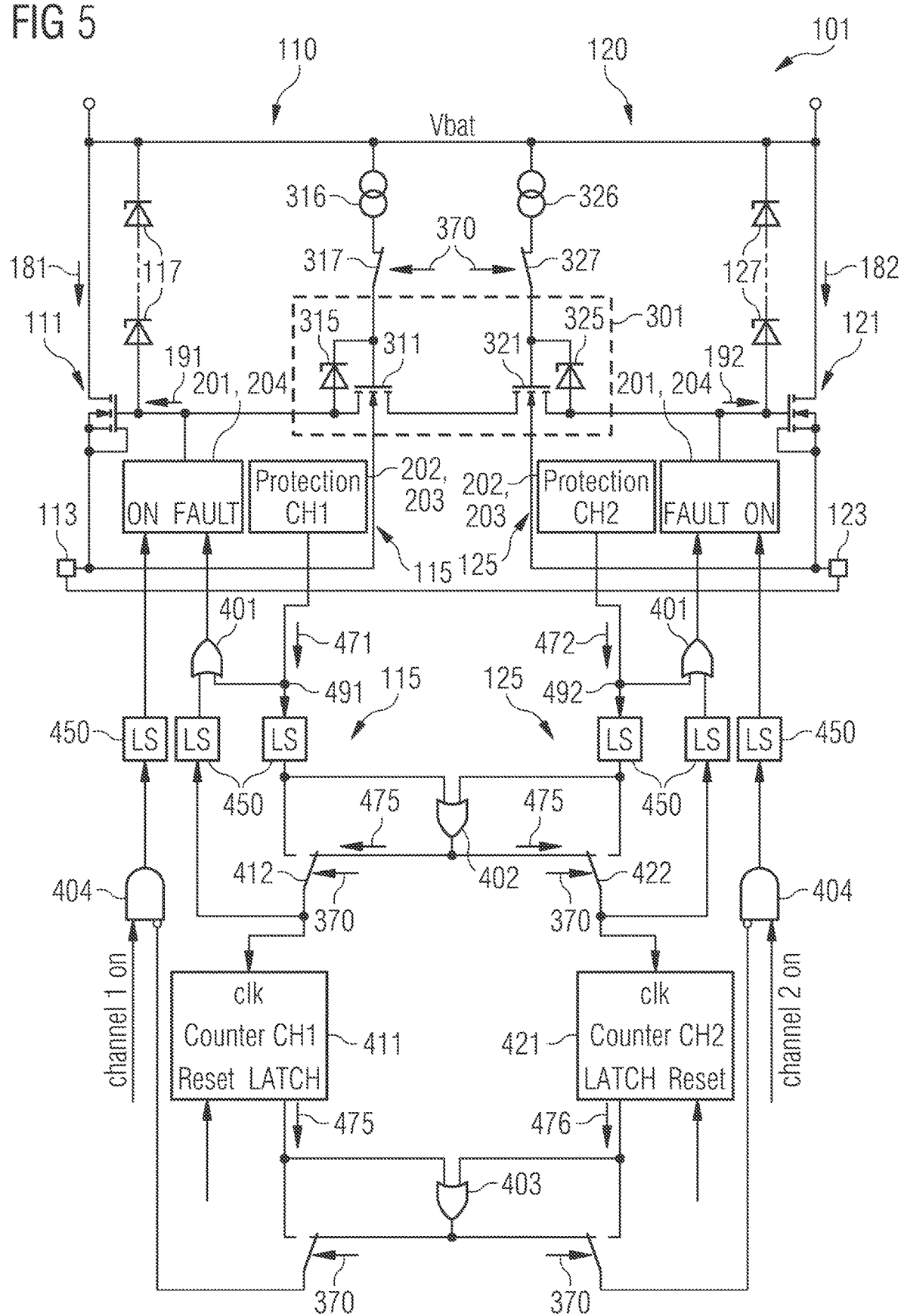
FIG. 5 schematically illustrates a circuit including a first MOS power transistor and a second MOS power transistor and a switch in-between the gate terminals of the first MOS power transistor and the second MOS power transistor, wherein the circuit further includes control circuitry for the first MOS power transistor and for the second MOS power transistor according to various examples.

FIG. 5 illustrates aspects with respect to the circuit 101. The circuit 101 according to the example of FIG. 5 generally corresponds to the circuit 101 according to the example of FIG. 3. FIG. 5 furthermore illustrates aspects with respect to an emergency shutdown of both MOS power transistors 111, 121 in response to detecting a failure condition of at least one of the MOS power transistors 111, 121. Thus, FIG. 5 illustrates aspects of synchronized control of the MOS power transistors 111, 121 to avoid asymmetries between the MOS power transistors 111, 121.

FIG. 5, in particular, illustrates aspects with respect to the control circuitries 115, 125. In the scenario of FIG. 5, each control circuitry 115, 125 includes sensors 202, 203 configured to detect failure conditions—e.g., overcurrent, overtemperature, or differential temperature—of the respective MOS power transistors 111, 121. The sensors 202, 203 associated with the channel 110 are configured to output a sensor signal 471. The sensor signal 471 is indicative of a detected failure condition of the MOS power transistor 111. Likewise, the sensors 202, 203 associated with the channel 120 are configured to output a sensor signal 472. The sensor signal 472 is indicative of a detected failure condition of the MOS power transistor 121. Both sensor signals 471, 472 are fed to an OR-logic element 402 via respective level shifters 450. The OR-logic element 402 is configured to output a combined sensor signal 475 based on the sensor signals 471, 472. For example, if at least one of the sensor signals 471, 472 is indicative of the respective fault condition, also the combined sensor signal is indicative of the fault condition.

The signals 471, 472, 475 may encode the fault condition in digital or in analog.

The combined sensor signal 475 is provided to the driver logic 201 and the gate control 204 of both channels 110, 120. Hence, the control circuitries 115, 125 are configured to determine the respective control signals 191, 192 based on the combined sensor signal 475. This enables operating both MOS power transistors 111, 121 in the high-resistivity state if a failure condition is detected in at least one of the MOS power transistors 111, 121. In particular in the scenario of a parallel channel configuration (as illustrated in FIG. 4), this has the effect of synchronized emergency shutdown to avoid asymmetric currents 181, 182.

By means of the switches 412, 422, it is possible to implement the control circuitry 115, 125 such that it selectively determines the respective control signal 191, 192 depending on the operating mode of the circuit 101. In particular, the combined sensor signal 475 is only forwarded to the driver logic 201 and the gate control 204 if the mode control signal 370 is indicative of the operating mode corresponding to the parallel channel configuration. Otherwise, a failure condition detected for channel 110 does not affect an emergency shutdown of the MOS power transistor 121 of the channel 120—and vice versa. This facilitates flexible applications of the circuit 101, both in parallel and non-parallel channel configuration.

Furthermore illustrated in FIG. 5 is the optional feature of directly forwarding the respective sensor signals 471, 472 to the respective driver logic 201 and gate control 204 by means of the branches 491, 492 and the OR-logic elements 401. This facilitates fast emergency shutdown.

In the scenario of FIG. 5, the control circuit 115 of the channel 110 includes a counter 411; and the control circuit 125 of the channel 120 includes a counter 421. The counters 411, 421 each maintain a counter value. The counter values of the counters 411, 421 are incremented based on the combined sensor signal 475 if the operating mode signal 370 is indicative of the parallel channel configuration. Hence, the counters 411, 421 are incremented in a synchronized manner. In particular in the scenario of a parallel channel configuration (as illustrated in FIG. 4), this has the effect of synchronized emergency shutdown to avoid asymmetric currents 181, 182.

If, e.g., the counter value of the counter 411 of the channel 110 exceeds a certain predefined threshold, a latch control signal 475 is output by the counter 411. The latch control signal 475 is then indicative of a latch failure condition. Via the optional AND-logic element 404, the latch control signal 475 is provided to the driver logic 201 and the gate control 204 of the channel 110. If the latch failure condition is signaled to the driver logic 201 and the gate control 204 of the channel 110, then the MOS power transistor 111 of the channel 110 is permanently operated in the high-resistivity state—until a reset of the counter 411 is performed.

As illustrated in FIG. 5, if the mode control signal 370 is indicative of the parallel channel configuration, the latch control signal 475 output by the counter 411 of the channel 110 also results in a latch failure condition of channel 120.

Thus, the control signal 191 for operating the MOS power transistor 111 in the low-resistivity state or the high-resistivity state is determined based on the counter value of, both, the counter 411 of the channel 110, as well as the counter 421 of the channel 120. Likewise, the control signal 192 for operating the MOS power transistor 121 in the low-resistivity state or the high-resistivity state is determined based on the counter value of, both, the counter 411 of the channel 110, as well as the counter 421 of the channel 120. For this, the OR-logic element 403 is provided. This again helps to synchronize operation of the MOS power transistors 111, 121 of the channels 110, 120 if the parallel channel configuration is used.

As will be appreciated from the explanation given above in connection with FIG. 4, generally, the control signal 191 to operate the MOS power transistor 111 in the high-resistivity state, as well as the control signal 192 to operate the MOS power transistor 121 in the high-resistivity state is provided by the control circuitries 115, 125 in response to detecting a failure condition in at least one of the MOS power transistors 111, 121. This synchronized emergency shutdown may be implemented on one or more layers, e.g., via the OR-logic element 402 and/or via the OR-logic element 403. All this helps to avoid asymmetries in the operation of the MOS power transistors 111, 121; this avoids isolated wear-out of individual MOS power transistors 111, 121.

Figure 6A:
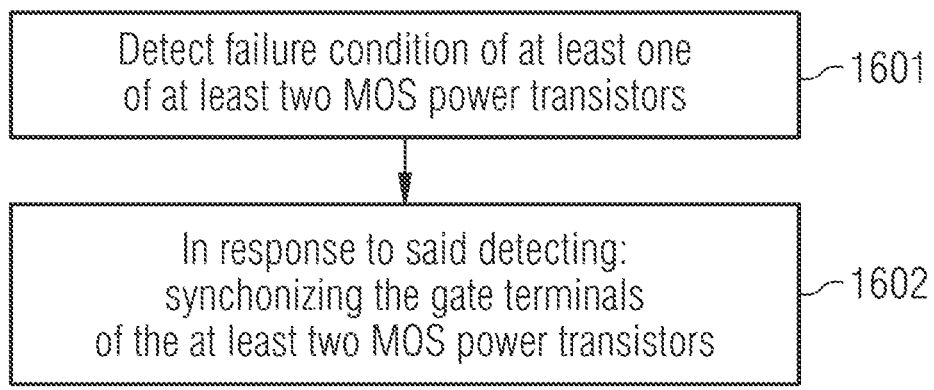
FIG. 6A is a flowchart of a method according to various examples.

FIG. 6A is a flowchart of a method according to various examples. In block 1601, a failure condition of at least one of at least two MOS power transistors is detected. For example, the failure condition may pertain to overtemperature, and overcurrent, and/or a differential temperature.

Then, in block 1602, the gate terminals of the at least two MOS power transistors are synchronized, in response to said detecting of the failure condition. Synchronizing the gate terminals mitigates asymmetries between the at least two MOS power transistors. Thereby, asymmetries in the currents 181, 182 such as inductive commutation currents are avoided. Selective wear-out of one or few of the at least two MOS power transistors may be reduced.

Synchronizing the at least two MOS power transistors can be implemented using one or more measures. For example, it would be possible to connect the gate terminals of the at least two MOS power transistors, e.g., using the switch 301 according to various examples described herein. For example, the switch may be implemented using one or more MOS transistors. Then, said connecting may include operating a first MOS transistor in a low-resistivity state and operating a second MOS transistor in a low-resistivity state. A further example measure for said synchronizing of the at least two MOS power transistors may include synchronizing gate drivers of the gate terminals of the at least two MOS power transistors. For example, techniques as discussed in connection with FIG. 5 may be employed.

Execution of block 1602 may be selectively activated, i.e., it may be possible to deactivate execution of block 1602. The method may include selectively activating said connecting of the gate terminals depending on an operating mode of a circuit comprising the at least two MOS power transistors, wherein the operating mode is optionally indicated by at least one of a peripheral interface command and a control memory value. Techniques as explained in connection with the control signal 370 may be employed in this regard.

Figure 6B:
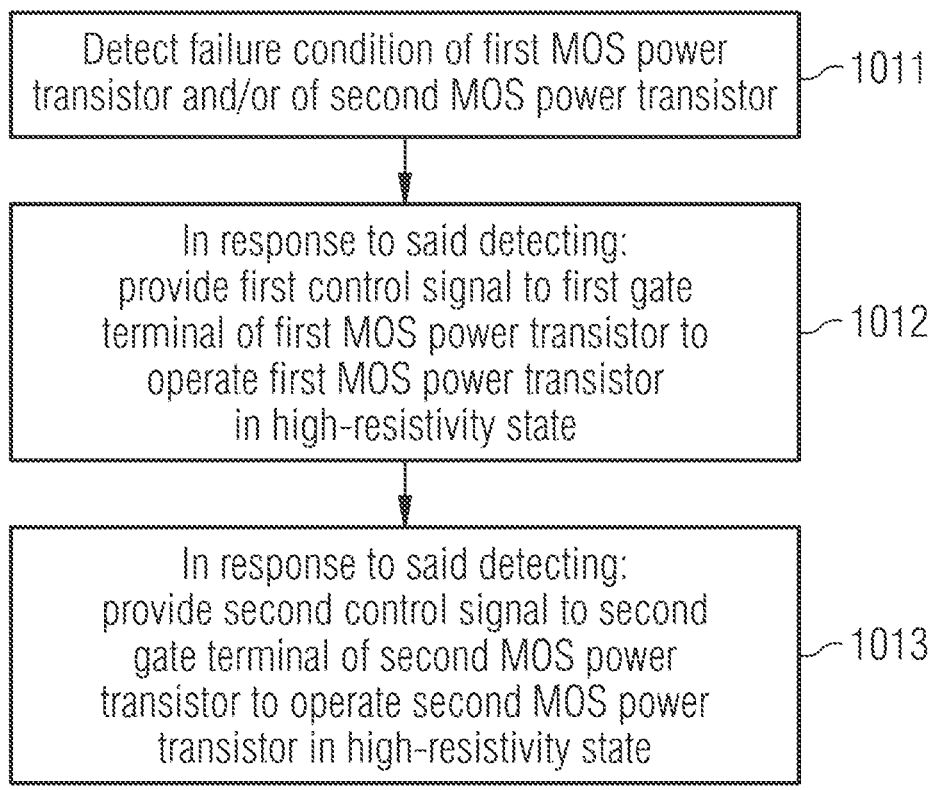
FIG. 6B is a flowchart of a method according to various examples.

FIG. 6B is a flowchart of a method according to various examples. In block 1011, a failure condition of a first MOS power transistor and/or of a second MOS power transistor is detected. For example, the failure condition may pertain to overtemperature, and overcurrent, and/or a differential temperature.

Then, in block 1012, in response to said detecting of the at least one failure condition in block 1011, a first control signal is provided to the first gate terminal of the first MOS power transistor to operate the first MOS power transistor in a high-resistivity state. This corresponds to an emergency shutdown of the first MOS power transistor.

Next, in block 1013, again in response to said detecting of the at least one failure condition in block 1011, a second control signal is provided to the second gate terminal of the second MOS power transistor to operate the second MOS power transistor in a high-resistivity state. This corresponds to an emergency shutdown of the second MOS power transistor.

For example, it would be possible that blocks 1012 and 1013 are executed essentially in parallel or at least partly in parallel.

For example, the method according to the example of FIG. 6B could be executed by the circuit 101 according to the example of FIG. 5.

FIG. 7 is a flowchart of a method according to various examples. For example, the method according to the flowchart of FIG. 7 could be executed by the circuit 101 according to the example of FIG. 5. The functioning of the circuit 101 according to the example of FIG. 5 will be explained in greater detail in connection with the method according to the flowchart of FIG. 7.

In FIG. 7, in block 1021, a failure condition is detected for the channel 110. For example, this may correspond to overcurrent, e.g., because the load 102 connected to both output pins 113, 123 is shorted. Then, the current 181 through the MOS power transistor 111 increases and eventually crosses a threshold. This is detected by the appropriate sensor 202.

When the current 181 through the MOS power transistor 111 increases, generally, also the current 182 through the MOS power transistor 121 of the channel 120 increases. However, due to a manufacturing spread or other differences, it is possible that the control circuitry 115 of the channel 110 detects the failure condition earlier than the control circuitry 125 of the channel 120. This is why in block 1021 the failure condition is solely detected for the MOS power transistor 111 of the channel 110, but not for the MOS power transistor 121 of the channel 120.

Then, in block 1022 and emergency shutdown is performed for the MOS power transistor 111 of the channel 110. This may be implemented by the sensor signal 471 being fed to the driver logic 201 and the gate control 204 directly via branch 491. Due to this direct feedback from the sensor 202 to the driver logic 201 and the gate control 204, there is a tendency that the emergency shutdown is performed quicker for the MOS power transistor 111 of the channel 110 at which the failure condition is detected than for the MOS power transistor 121 of the other channel 120.

Eventually, in block 1023, an emergency shutdown is also performed for the MOS transistor 121 of the channel 120. This may be achieved by means of the combined sensor signal 475 obtained by the OR-logic element 402. Because the circuit 101 is operated in the operating mode corresponding to the parallel channel configuration, the combined sensor signal 471 indicative of the failure condition is forwarded via the switch 422 to the driver logic 201 and a gate control 204 of the channel 120.

Then, both, the MOS power transistor 111, as well as the MOS power transistor 121 are operated in the high-resistivity state. However, the inductance 105 stores energy and, consequently, the voltage difference between the source terminals 92 and the drain terminals 93 of the MOS power transistors 111, 121 increases until the clamping voltage is reached.

Eventually, the voltage difference between the drain terminals 91 and the gate terminals 93 of both MOS power transistors 111, 121 cross a threshold voltage; this results in the switch 301 coupling the gate terminals 93 of both MOS power transistors 111, 121, block 1024

The voltage difference increases further and then one of the two voltage differences between the source terminals 92 and the gate terminals 93 of the MOS power transistors 111, 121 crosses the respective clamp voltage of the respective clamp 116, 126. In the scenario of FIG. 7, due to a mismatch between the clamp voltages of the clamps 116, 126, initially in block 1025 the MOS power transistor 111 is clamped, i.e., a fixed voltage difference is set and maintained between the source terminal 92 and the gate terminal 93; only subsequently, in block 1026, the MOS power transistor 121 is clamped.

Even though the clamp voltages of the clamps 116, 126 may differ from each other, due to the coupling of the gate terminals 93, the voltage difference across both MOS power transistors 111, 121 is the same. Thus, the discharge currents used to discharge the inductance 105 exhibit a comparably small or no difference. This avoids isolated wear out of one of the MOS power transistors 111, 121.

This functioning is also illustrated in connection with FIGS. 8-13.

FIG. 8 illustrates the time evolution of the voltage 870 between the drain terminal 91 and the source terminal 92 of the MOS power transistor 111 of the channel 110. In the scenario FIG. 8, the switch 301 is permanently operated in a high-resistivity state; e.g., because the operating mode signal 370 is set appropriately, i.e., indicative of the non-parallel channel configuration. Nonetheless, in the scenario FIG. 8, the load is connected to both output pins 113, 123, i.e., a parallel channel configuration is in fact implemented, even if it is otherwise indicated by the operating mode signal 370.

At a certain time, a failure condition 801 occurs. Then, the failure condition 801 is detected by the respective sensor 202, 203 and an emergency shutdown 802 is performed. As the MOS power transistor 111 is operated in the high-resistivity state, the voltage 870 increases. At 803, the voltage 870 is clamped to the clamp voltage 850. At 804, the energy stored in the inductance 105 is fully dissipated. Then, the voltage 870 decreases again.

The voltage 870 between drain terminal 91 and source terminal 92 is approximately proportional to the gate-drain voltage.

FIG. 9 illustrates the current 181 through the MOS power transistor 111 (dashed line in FIG. 9) and the current 182 through the MOS power transistor 121 (dotted line) for the scenario FIG. 8. Thus, also in FIG. 9, the switch 301 is permanently operated in the high-resistivity state. The total current 183 is also illustrated (full line).

The clamp voltages 850 differ for the clamps 116, 126. Therefore, there is a large mismatch in the currents 181, 182. This corresponds to asymmetric operation of the MOS power transistors 111, 121 and may result in increased wear out of the MOS power transistors 121 experiencing the larger current 182.

FIG. 10 illustrates the integrated dissipated energy 871 at the MOS power transistor 111 (dashed line) and at the MOS power transistor 121 (dotted line) due to the respective currents 181, 182. As illustrated in FIG. 10, due to the larger current 182 through the MOS power transistor 121, the integrated dissipated energy 871 at the MOS power transistor 121 is much larger than the integrated dissipated energy 871 at the MOS power transistor 111. This asymmetry can cause malfunctioning of the MOS power transistor 121 due to increased wear out.

FIGS. 11-13 generally correspond to FIGS. 8-10. Also in the scenarios of FIGS. 11-13, the load is connected to both output pins 113, 123, i.e., a parallel channel configuration is implemented. In FIGS. 11-12 operation of the switch 301 in the low-resistivity state is enabled; e.g., because the operating mode signal 370 is set appropriately and is indicative of the parallel channel configuration.

As the voltage crosses the threshold 851, the switch 301 begins operation in the low-resistivity state, from 809 onwards. Hence, the difference between the currents 181, 182 is reduced from 809 onwards (cf. FIG. 12). Hence, the difference between the integrated dissipated energy 871 at the MOS power transistor 111 and the MOS power transistor 121 (cf. FIG. 13) is much smaller in the scenario if compared to the scenario of FIGS. 8-10. This avoids damage to the MOS power transistor 121, because the dissipated energy is evenly distributed between both MOS power transistors 121, 111. Symmetric wear out is achieved. Asymmetries are avoided by the synchronized operation.

Now referring to FIGS. 14-18, aspects with respect to the switch 301 are described. In the various examples described herein, different implementations of the switch 301 can be used:

For example, the switch 301 according to the scenarios of FIGS. 3 and 5 employs MOS transistors 311, 321; this may facilitate manufacturing and integration with the MOS power transistors 111, 121, because all transistors 111, 121, 311, 321 are n-type.

Further, in the scenario FIG. 5, the switch 301—and, thus, the MOS transistors 311, 321—are operated in the low-resistivity state only if the voltage between the gate terminal 93 and the drain terminal 91 exceeds the threshold 851. For example, for a typical implementation, this could correspond to a threshold 851 in the order of 3 Volt to 5 Volt. This is based on the finding that the low-resistivity state of the switch 301 is only required during clamping to ensure short circuit robustness. Hence, the implementation of the switch 301 according to the scenarios of FIGS. 3 and 5 has the advantage that it is compliant also with a non-parallel channel configuration: here, the control signals 191, 192 of the gate terminals 93 are operated independently by the control circuitry 115 of the channel 110 and the control circuitry 125 of the channel 120, respectively. Such independent operation in the non-parallel channel configuration may result in a scenario where one gate terminal is even above Vbat (MOS power transistor in low-resistivity state) while the other gate terminal is below ground (MOS power transistor clamped). Such large voltage differences between the gate terminals 93 of the MOS power transistors 111, 121 are tolerated by the configuration of the switch 301 according to the examples of FIGS. 3 and 5. Thus, the switch 301 flexibly supports, both, parallel channel configuration and non-parallel channel configuration. A similar effect may be achieved with the implementations of the switch 301 according to the scenarios of FIGS. 14-18.

Figure 14:
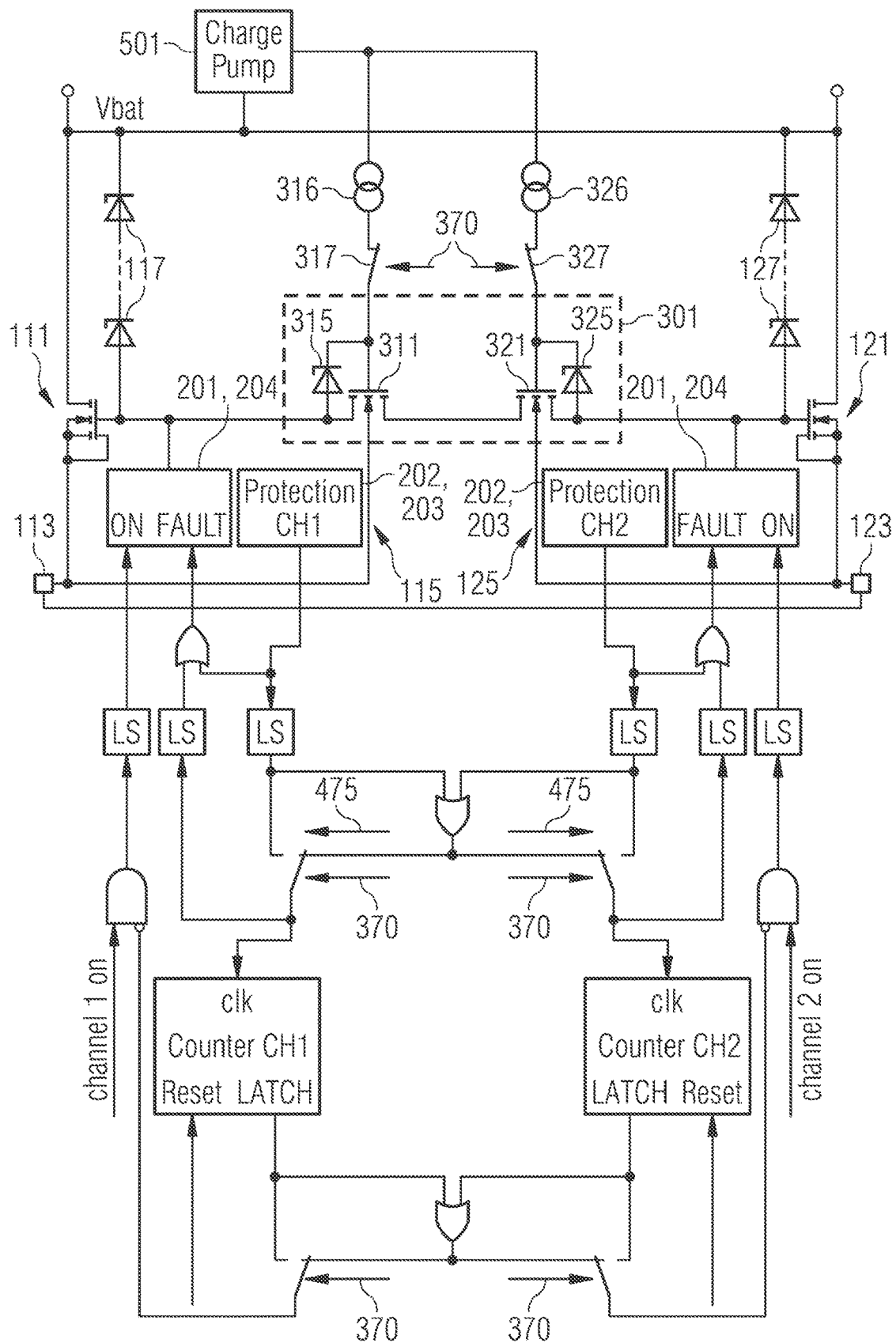
FIG. 14 schematically illustrates a circuit including a first MOS power transistor and a second MOS power transistor and a switch in-between the gate terminals of the first MOS power transistor and the second MOS power transistor.

In FIG. 14, a charge pump 501 connected to Vbat is employed. The charge pump is configured to provide a voltage independently and thus even above Vbat. This enables the activation of the N-Channel gate connection switches 311, 321 at every output voltage/voltage drop across the MOS power transistors 111, 121. I.e., this enables operation of the switch 301 in the low-resistivity state irrespective of the voltage difference across the MOS power transistors 111, 121. This eliminates the limitation that the gates of the MOS power transistors 111, 121 can only be connected via the switch 301 when the voltage at the output terminals 113, 123 is significantly below the supply voltage Vbat.

In the example of FIG. 14, in some scenarios a multi-stage charge pump 501 may be employed in order to ensure a sufficiently large voltage difference between the control terminal 93 and the source terminal 92 of the MOS transistors 311, 321. This is because there is already a positive voltage difference between the gate terminal 93 and the drain terminal 91 of the MOS power transistors 111, 121 if the MOS power transistors 111, 121 are operated in the low-resistivity state. Thus, to provide an even larger positive voltage difference between the gate terminal 93 and the source terminal 92 of the MOS transistors 311, 321, a multi-stage charge pump 501 may be employed.

In FIG. 14, the charge pumps 501 is configured to control the switch 301 based on the voltage at the drain terminal 91 of the MOS power transistors 111, 121.

Figure 15:
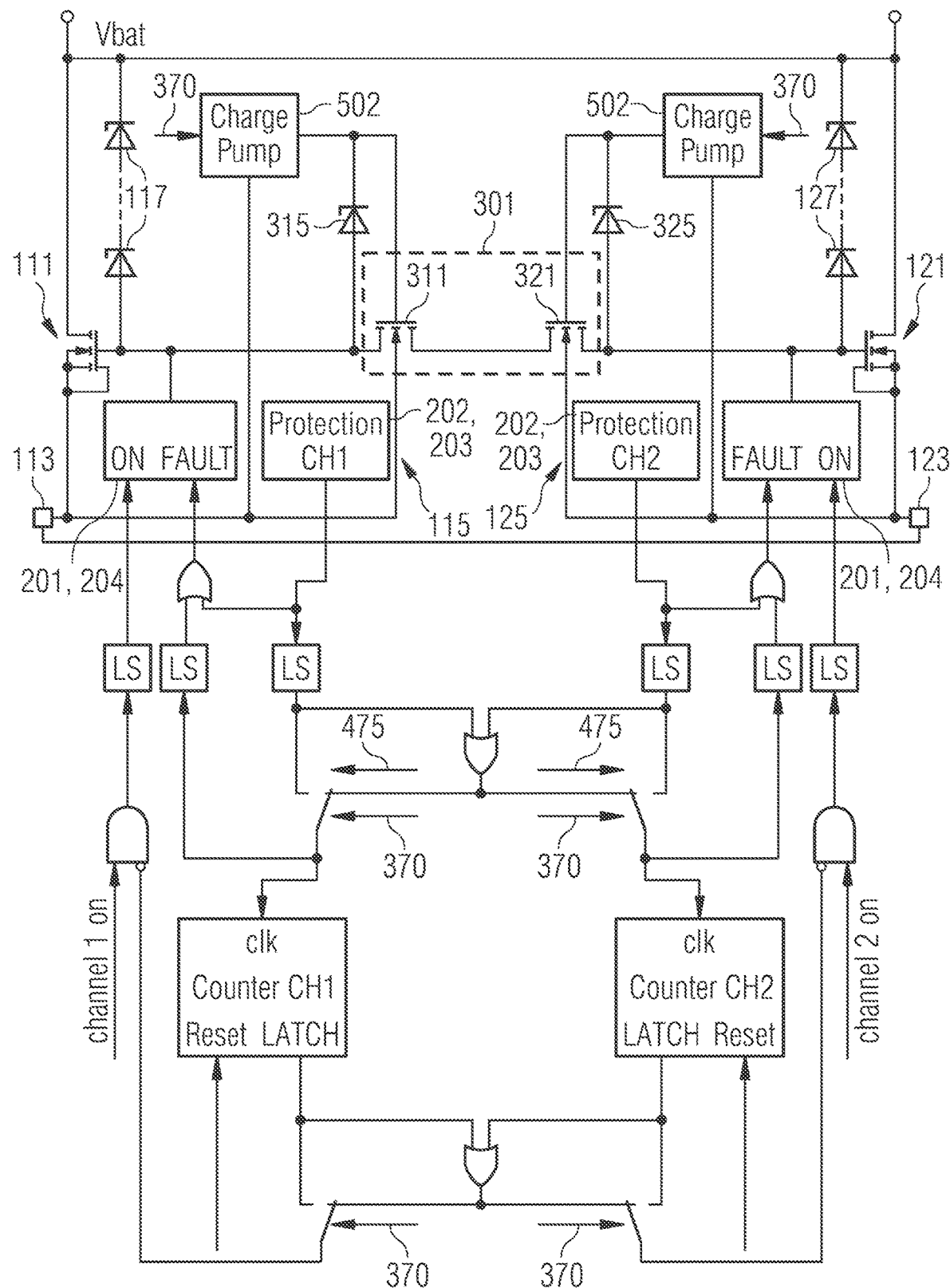
FIG. 15 schematically illustrates a circuit including a first MOS power transistor and a second MOS power transistor and a switch in-between the gate terminals of the first MOS power transistor and the second MOS power transistor.

FIG. 15 generally corresponds to FIG. 14. However, in FIG. 15, instead of employing the switches 317, 327, the charge pumps 502 are operated in accordance with the operating mode control signal 370. Also, the charge pumps 502 are at the voltage level of the source terminals 92 of the respective MOS power transistor 111, 121. Thus, the charge pumps 502 are configured to control the switch 301 based on the voltage at the source terminals 92 of the MOS power transistors 111, 121. This eliminates the need of the high voltage current sources 316 and might be preferred in some fabrication technologies.

Figure 16:
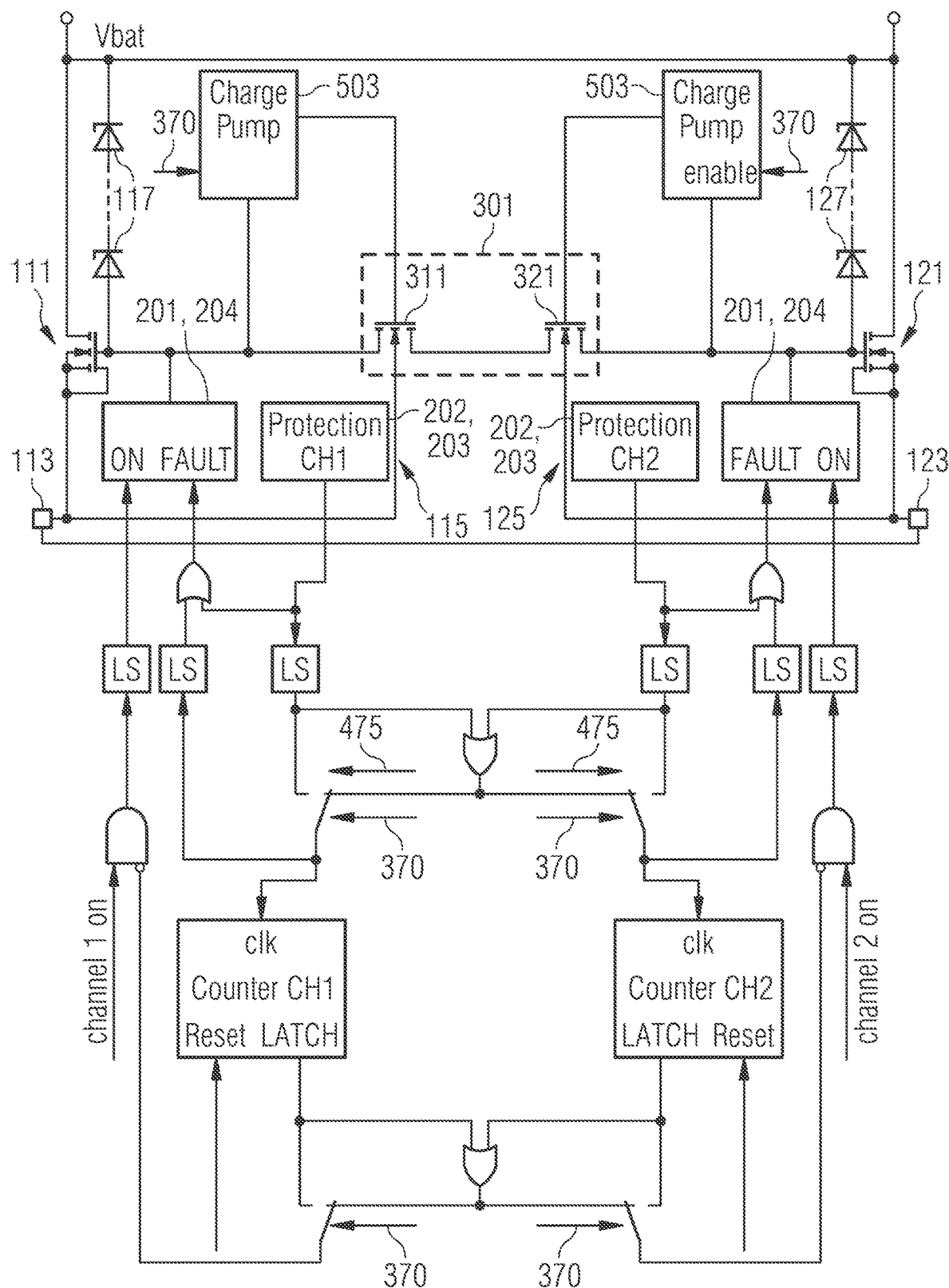
FIG. 16 schematically illustrates a circuit including a first MOS power transistor and a second MOS power transistor and a switch in-between the gate terminals of the first MOS power transistor and the second MOS power transistor.

In FIG. 16, the charge pumps 503 are at the voltage level of the gate terminal 93 of the respective MOS power transistor 111, 121. Hence, the charge pumps 503 are configured to control the switch 301 based on the voltage at the gate terminals 93 of the MOS power transistors 111, 121. In contrast to FIG. 15, the charge pumps 503 need to pump only the gate-source voltage difference for the switches 311, 321, where in FIG. 15 the pumps 502 needs to deliver a voltage as high as the gate-source voltage difference of the MOS power transistor 111, 121 plus the gate-source voltage difference of the switches 311, 321. Thus, in FIG. 16, there may be no need to provide multi-stage charge pumps 503.

Figure 17:
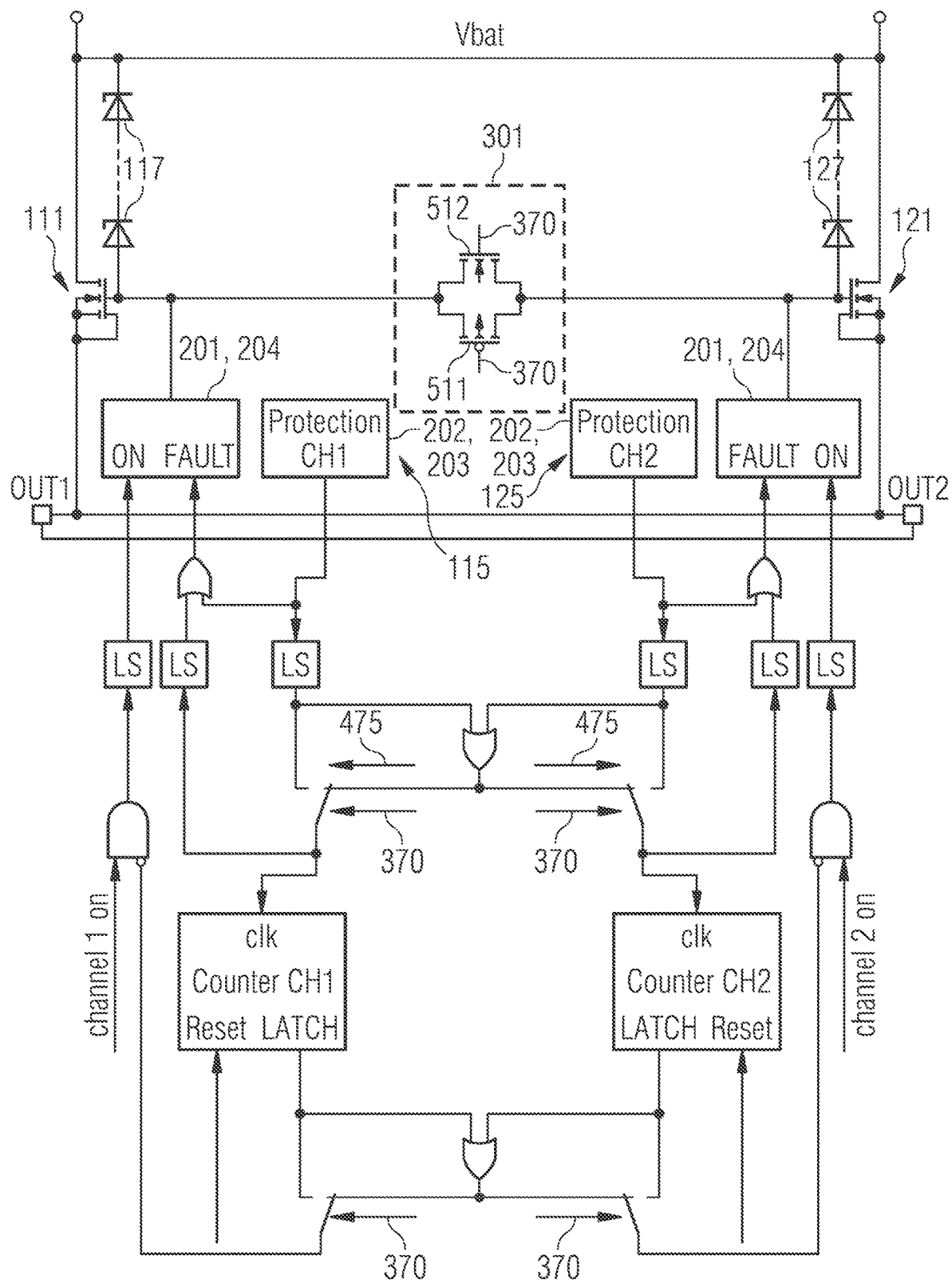
FIG. 17 schematically illustrates a circuit including a first MOS power transistor and a second MOS power transistor and a switch in-between the gate terminals of the first MOS power transistor and the second MOS power transistor.

In FIG. 17, a transmission gate formed by the N-type MOS transistor 512 and the P-type MOS transistor 511 is employed as switch 301. If appropriate devices are available in the fabrication technology, this concept enables the connection of the MOS Power transistors at any output voltage level without the need of a charge pump. Care must be taken on the biasing of the bulk and the gates of the transistors 511, 512 of the transmission gate. Additional transistors might be required to realize this concept.

Figure 18:
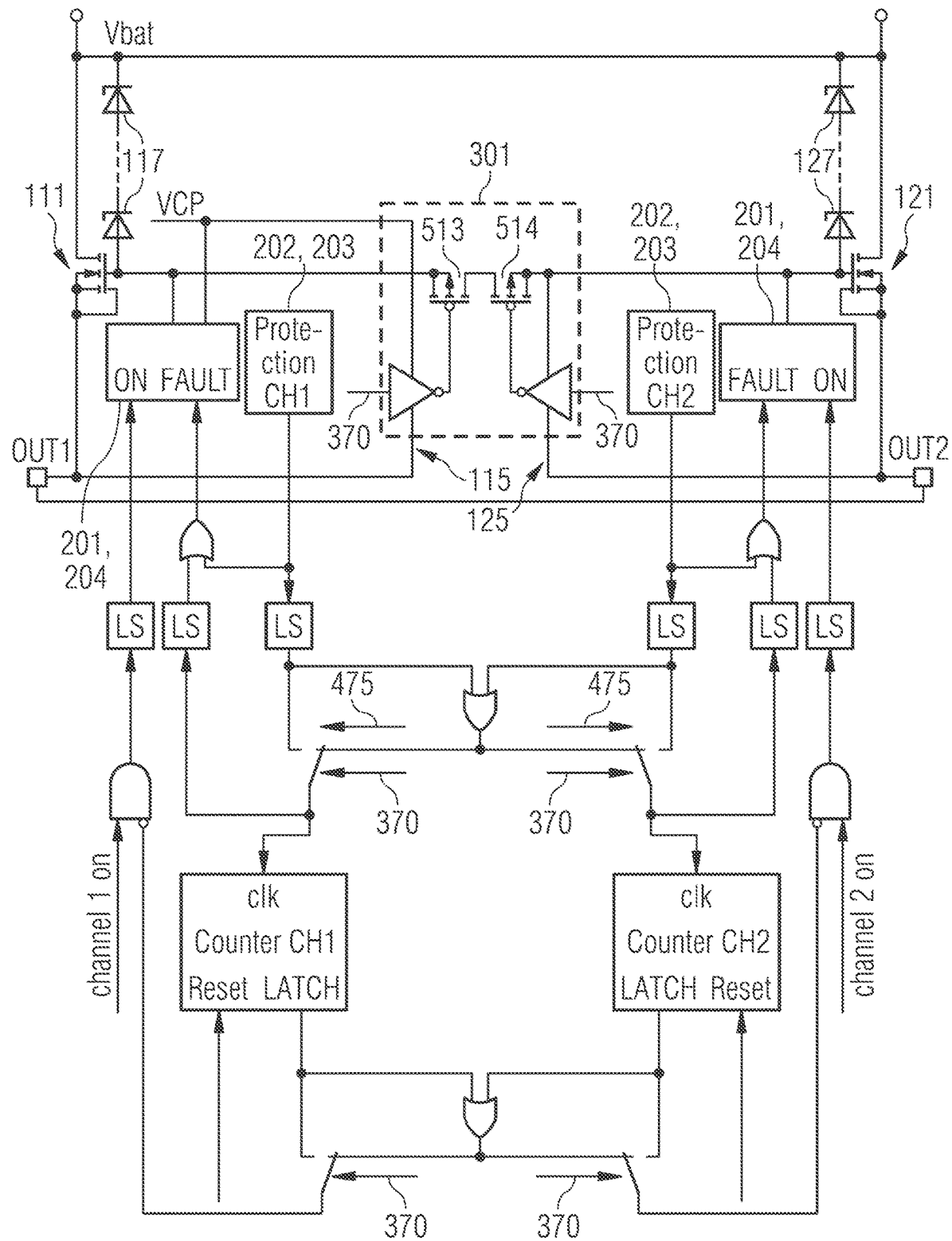
FIG. 18 schematically illustrates a circuit including a first MOS power transistor and a second MOS power transistor and a switch in-between the gate terminals of the first MOS power transistor and the second MOS power transistor.

In FIG. 18, two isolated HV P-type MOS transistors 513, 514 are employed. To ensure the connection of the gates 93 of the MOS power transistors 111, 121 in any operating state except cutoff, the threshold voltage of the isolated HV P-type MOS Transistors 513, 514 is significantly smaller than the threshold voltages of the N-type MOS power transistors.

A scenario corresponding to the scenario of FIG. 18 could also be implemented using p-type MOS power transistors and n-type transistors of the switch 301.

Summarizing, above techniques of synchronizing the gate terminals of power transistors in parallel channel configuration are described. Synchronizing may be achieved by selectively coupling the gate terminals in a clamped state of the power transistors. Alternatively or additionally, synchronizing may be achieved by using a fault condition detected for one of the two power transistors also for an emergency shutdown of the other one of the two power transistors.

Thus, the following examples have been described:

Example 1

A circuit (101), comprising:
a first MOS power transistor (111, 121) having a first gate terminal (93), a first drain terminal (91), and a first source terminal (92),
a second MOS power transistor (111, 121) having a second gate terminal (93), a second drain terminal (91), and a second source terminal (92), and
a switch (301) connected in-between the first gate terminal (93) and the second gate terminal (93) and configured to selectively couple the first gate terminal (93) and the second gate terminal (93).

Example 2

The circuit (101) of example 1, further comprising:
a first clamp (116, 126) between the first drain terminal and the first gate terminal (93), the first clamp (116, 126) having a first clamp voltage (850),
a second clamp (116, 126) between second drain terminal (92) and the second gate terminal (93), the second clamp (116, 126) having a second clamp voltage (850),
wherein the second clamp voltage (850) does not match the first clamp voltage (850).

Example 3

The circuit (101) of examples 1 or 2,
wherein the switch (301) is configured to selectively couple the first gate terminal (93) and the second gate terminal (93) depending on a voltage difference between at least one of or both of: (i) the first drain terminal (91) and the first gate terminal (93), and (ii) the second drain terminal (91) and the second gate terminal (93).

Example 4

The circuit (101) of example 3,
wherein the switch (301) is configured to couple the first gate terminal (93) and the second gate terminal (93) if the voltage difference between the first drain terminal and the first gate terminal (93) exceeds a first threshold (851) and if the voltage difference between the second drain terminal (92) and the second gate terminal (93) exceeds a second threshold (851).

Example 5

The circuit (101) of any one of the preceding examples,
wherein the switch (301) is configured to couple the first gate terminal (93) and the second gate terminal (93) if at least one or both of, (i) the first MOS power transistor and (ii) the second MOS power transistor are operated in a high-resistivity state.

Example 6

The circuit (101) of any one of the preceding examples,
wherein the switch (301) is configured to couple the first gate terminal (93) and the second gate terminal (93) if at least one of the first MOS power transistor and the second MOS power transistor are clamped by a respective clamp (116, 126).

Example 7

The circuit (101) of any one of the preceding examples, further comprising:

a control circuitry (115, 125, 201-204, 251, 252) configured to selectively activate control of the switch (301) between operation in a low-resistivity state and a high-resistivity state depending on an operating mode of the circuit (101), wherein the operating mode is optionally indicated by at least one of a peripheral interface command and a control memory value.

Example 8

The circuit (101) of any one of the preceding examples, wherein the switch (301) comprises at least one further MOS transistor (311, 321), wherein the first MOS power transistor (111, 121), the second MOS power transistor (111, 121), and the at least one further MOS transistor (311, 321) are all n-type or are all p-type, and are all optionally integrated on a common die.

Example 9

The circuit (101) of any one of the preceding examples, wherein the switch (301) comprises a first further MOS transistor (311, 321) and a second further MOS transistor (311, 321), wherein a body terminal of the first further MOS transistor (311, 321) is coupled with the first source terminal (92), wherein a body terminal of the second further MOS transistor (311, 321) is coupled with the second source terminal (92), wherein an source terminal (92) of the first further MOS transistor (311, 321) is coupled with the first gate terminal (93), wherein an source terminal (92) of the second further MOS transistor (311, 321) is coupled with the second gate terminal (93), wherein an drain terminal (91) of the first further MOS transistor (311, 321) is coupled with an drain terminal (91) of the second further MOS transistor (311, 321).

Example 10

The circuit (101) of any one of examples 1-7, wherein the switch (301) comprises a transmission gate.

Example 11

The circuit (101) of any one of examples 1-7, wherein the switch (301) is controlled by at least one charge pump (501, 502, 503).

Example 12

The circuit (101) of example 11, wherein the at least one charge pump (501) is configured to provide a voltage to the switch based on at least one of a voltage at the first drain terminal and a voltage at the second drain terminal.

Example 13

The circuit (101) of example 11, wherein the at least one charge pump is configured to provide a voltage to the switch based on at least one of a voltage of the first source terminal and a voltage at the second source terminal.

Example 14

The circuit (101) of example 11, wherein the at least one charge pump is configured to provide a voltage to the switch based on at least one of a voltage at the first gate terminal and a voltage at the second gate terminal.

Example 15

The circuit (101) of any one of examples 1-7, wherein the first MOS power transistor (111, 121) and the second MOS power transistor (111, 121) are n-type, wherein the switch (301) comprises MOS transistors which are p-type (513, 514).

Example 16

The circuit (101) of example 15, wherein the threshold voltage of the at least one further MOS transistor (513, 514) is smaller than the threshold voltages of the first MOS power transistor and the second MOS power transistor.

Example 17

A circuit (101), comprising:

a first MOS power transistor (111, 121) having a first gate terminal (93), a first drain terminal (91), and a first source terminal (92), a second MOS power transistor (111, 121) having a second gate terminal (93), a second drain terminal (91), and a second source terminal (92), and a control circuitry (115, 125, 201-204, 251, 252) configured to detect a failure condition (801) of at least one of the first MOS power transistor (111, 121) and the second MOS power transistor (111, 121), wherein the control circuitry (115, 125, 201-204, 251, 252) is configured to provide a first control signal (191, 192) to the first gate terminal (93) to operate the first MOS power transistor (111, 121) in a high-resistivity state and to provide a second control signal (191, 192) to the second gate terminal (93) to operate the second MOS power transistor (111, 121) in a high-resistivity state, in response to said detecting of the failure condition (801).

Example 18

The circuit (101) of example 17, wherein the control circuitry (115, 125, 201-204, 251, 252) comprises a first sensor (202, 203) configured to detect the failure condition (801) of the first MOS power transistor (111, 121) and to output a first sensor signal (471, 472) indicative of the detected failure condition (801) of the first MOS power transistor (111, 121), wherein the control circuitry (115, 125, 201-204, 251, 252) comprises a second sensor (202, 203) configured to detect the failure condition (801) of the second MOS power transistor (111, 121) and to output a second sensor signal (471, 472) indicative of the detected failure condition (801) of the second MOS power transistor (111, 121), wherein the control circuitry (115, 125, 201-204, 251, 252) comprises an OR-logic element (402, 403) configured to output a combined sensor signal (475) based on the first sensor signal (471, 472) and the second sensor signal (471, 472), wherein the control circuitry (115, 125, 201-204, 251, 252) is configured to determine the first control signal (191, 192) based on the combined sensor signal (475) and to determine the second control signal (191, 192) based on the combined sensor signal (475).

Example 19

The circuit (101) of example 18, wherein the control circuitry (115, 125, 201-204, 251, 252) is configured to selectively determine the first control signal (191, 192) based on the combined sensor signal (475) depending on an operating mode of the circuit (101), wherein the control circuitry (115, 125, 201-204, 251, 252) is configured to selectively determine the second control signal (191, 192) based on the combined sensor signal (475) depending on the operating mode of the circuit (101).

Example 20

The circuit (101) of examples 18 or 19, wherein the control circuitry (115, 125, 201-204, 251, 252) further comprises a failure counter (411, 421), wherein the control circuitry (115, 125, 201-204, 251, 252) is configured to increment the failure counter (411, 421) based on the first sensor signal (471, 472) or the combined sensor signal (475).

Example 21

The circuit (101) of example 20, wherein the control circuitry (115, 125, 201-204, 251, 252) is configured to determine the first control signal (191, 192) based on a counter value of the failure counter (411, 421), wherein the control circuitry (115, 125, 201-204, 251, 252) is configured to determine the second control signal (191, 192) based on the counter value of the failure counter (411, 421).

Example 22

The circuit (101) of any one of examples 18-21, wherein the control circuitry (115, 125, 201-204, 251, 252) further comprises a first level shifter (450) connected in-between the first sensor (202, 203) and the OR-logic element (402, 403) and configured to shift the level of the first sensor signal (471, 472), wherein the control circuitry (115, 125, 201-204, 251, 252) further comprises a second level shifter connected in-between the second sensor (202, 203) and the OR-logic element (402, 403) and configured to shift the level of the second sensor signal (471, 472).

Example 23

The circuit (101) of any one of examples 17-22, wherein the control circuitry (115, 125, 201-204, 251, 252) comprises a first driver configured to generate the first control signal (191, 192) depending on a first state signal, wherein the control circuitry (115, 125, 201-204, 251, 252) comprises a second driver configured to generate the second control signal (191, 192) depending on a second state signal which is different from the second state signal, wherein the control circuitry is configured to determine the first state signal and the second state signal based on the combined sensor signal (475).

Example 24

A system, comprising:

the circuit (101) of any one of examples 1-16, and an electric load connected to the first source terminal (92) and the second source terminal (92).

Example 25

A system, comprising:

the circuit (101) of any one of examples 17-23, and an electric load connected to the first source terminal (92) and the second source terminal (92).

Example 26

A method, comprising:

detecting a failure condition of at least one of at least two MOS power transistors, and in response to detecting the failure condition: synchronizing the gate terminals of the at least two MOS power transistors.

Example 27

The method of example 26, further comprising:

in response to detecting the failure condition: connecting the gate terminals of the at least two MOS power transistors.

Example 28

The method of example 27, further comprising:

selectively activating said connecting of the gate terminals depending on an operating mode of a circuit comprising the at least two MOS power transistors, wherein the operating mode is optionally indicated by at least one of a peripheral interface command and a control memory value.

Example 29

The method of any one of examples 26-28, further comprising:

in response to detecting the failure condition: operating a first MOS transistor in a low-resistivity state and operating a second MOS transistor in a low-resistivity state.

Example 30

The method of any one of examples 26-29, further comprising:

in response to detecting the failure: synchronizing gate drivers of the gate terminals of the at least two MOS power transistors.

Example 31

A method, comprising:
selectively coupling a first gate terminal (93) of a first MOS power transistor (111, 121) and a second gate terminal (93) of a second MOS power transistor (111, 121).

Example 32

The method of example 31, further comprising:
detecting a trigger criterion,
in response to said detecting of the trigger criterion: operating a switch (301) to couple the first gate terminal and the second gate terminal,
wherein the trigger criterion is at least one of:
a voltage difference between the first gate terminal and the a first drain terminal of the first MOS power transistor;
a voltage difference between the second gate terminal and a second drain terminal of the second MOS power transistor;
the first MOS power transistor being operated in a high-resistivity state;
the second MOS power transistor being operated in a high-resistivity state;
the first MOS power transistor being clamped by an associated first clamp;
the second MOS power transistor being clamped by an associated second clamp;
an overvoltage failure condition detected for the first MOS power transistor;
an overvoltage failure condition detected for the second MOS power transistor;
an overtemperature failure condition detected for the first MOS power transistor;
an overtemperature failure condition detected for the second MOS power transistor;
a differential temperature failure condition detected for the first MOS power transistor;
a differential temperature failure condition detected for the second MOS power transistor;
an overcurrent failure condition detected for the first MOS power transistor; and
an overcurrent failure condition detected for the second MOS power transistor.

Example 33

The method of examples 31 or 32, further comprising:
selectively activating control of the switch (301) between operation in a low-resistivity state and a high-resistivity state depending on an operating mode of the circuit (101),
wherein the operating mode is optionally indicated by at least one of a peripheral interface command and a control memory value.

Example 34

The method of any one of examples 31-33, further comprising:
providing a first current through the first MOS power transistor to a load and concurrently providing a second current through the second MOS power transistor to the load.

Example 35

A method, comprising:
detecting a failure condition (801) of at least one of a first MOS power transistor (111, 121) and a second MOS power transistor (111, 121),
in response to said detecting of the failure condition (801): providing a first control signal (191, 192) to a first gate terminal (93) of the first MOS power transistor (111, 121) to operate the first MOS power transistor (111, 121) in a high-resistivity state and providing a second gate signal (191, 192) to a second gate terminal (93) of the second MOS power transistor (111, 121) to operate the second MOS power transistor (111, 121) in a high-resistivity state.

Example 36

The method of example 35, further comprising:
detecting the failure condition (801) of the first MOS power transistor (111, 121),
determining a first sensor signal (471, 472) indicative of the detected failure condition (801) of the first MOS power transistor (111, 121),
detecting the failure condition (801) of the second MOS power transistor (111, 121), and
determining a second sensor signal (471, 472) indicative of the detected failure condition (801) of the second MOS power transistor (111, 121),
determining a combined sensor signal (475) based on the first sensor signal (471, 472) and the second sensor signal (471, 472),
determining the first control signal (191, 192) based on the combined sensor signal (475), and
determining the second control signal (191, 192) based on the combined sensor signal (475).

Example 37

The method of example 36, further comprising:
depending on an operating mode of the circuit (101): selectively determining the first control signal (191, 192) based on the combined sensor signal (475), and/or
depending on the operating mode of the circuit (101): selectively determining the second control signal (191, 192) based on the combined sensor signal (475).

Example 38

The method of examples 36 or 37, further comprising:
incrementing a failure counter (411, 421) based on the first sensor signal (471, 472) or the combined sensor signal (475).

Example 39

The method of example 38, further comprising:
determining the first control signal (191, 192) based on a counter value of the failure counter (411, 421), and
determining the second control signal (191, 192) based on the counter value of the failure counter (411, 421).

Although the invention has been shown and described with respect to certain preferred embodiments, equivalents and modifications will occur to others skilled in the art upon the reading and understanding of the specification. The present invention includes all such equivalents and modifications and is limited only by the scope of the appended claims.

For illustration, while above various scenarios have been described with respect to scenarios where two power transistors are contributing to a parallel channel configuration, in other scenarios, it would be possible that a larger number of power transistors contributes to a parallel channel configuration. Also if three, four or even more power transistors contribute to a parallel channel configuration, it is possible to use the techniques described herein in order to selectively couple the gate terminals of this number of power transistors with each other; and/or trigger emergency shutdowns in all power transistors if a failure condition is detected for at least one of the power transistors.

For further illustration, while above various scenarios have been described with respect to MOS power transistors, similar techniques may also be employed for other kinds and types of power transistors.

The invention claimed is:

1. A circuit, comprising:
a first MOS power transistor comprising a first gate terminal, a first drain terminal, and a first source terminal,
a second MOS power transistor comprising a second gate terminal, a second drain terminal, and a second source terminal,
a switch connected in-between the first gate terminal and the second gate terminal and configured to selectively couple the first gate terminal and the second gate terminal,
a first clamp between the first drain terminal and the first gate terminal, the first clamp defining a first clamp voltage, and
a second clamp between second drain terminal and the second gate terminal, the second clamp defining a second clamp voltage,
wherein the second clamp voltage does not match the first clamp voltage.

2. The circuit of claim 1,
wherein the switch is configured to selectively couple the first gate terminal and the second gate terminal depending on a voltage difference between both, the first drain terminal and the first gate terminal, and the second drain terminal and the second gate terminal.

3. The circuit of claim 2,
wherein the switch is configured to couple the first gate terminal and the second gate terminal if the voltage difference between the first drain terminal and the first gate terminal exceeds a first threshold and if the voltage difference between the second drain terminal and the second gate terminal exceeds a second threshold.

4. The circuit of claim 1,
wherein the switch is configured to couple the first gate terminal and the second gate terminal if both, the first MOS power transistor and the second MOS power transistor are operated in a high-resistivity state.

5. The circuit of claim 1,
wherein the switch is configured to couple the first gate terminal and the second gate terminal if at least one of the first MOS power transistor and the second MOS power transistor are clamped by a respective clamp.

6. The circuit of claim 1, further comprising:
a control circuitry configured to selectively activate control of the switch between operation in a low-resistivity state and a high-resistivity state depending on an operating mode of the circuit,
wherein the operating mode is indicated by at least one of a peripheral interface command and a control memory value.

7. The circuit of claim 1,
wherein the switch comprises at least one further MOS transistor,
wherein the first MOS power transistor, the second MOS power transistor, and the at least one further MOS transistor are all n-type or are all p-type, and are all formed on a common die.

8. A circuit, comprising:
a first MOS power transistor comprising a first gate terminal, a first drain terminal, and a first source terminal,
a second MOS power transistor comprising a second gate terminal, a second drain terminal, and a second source terminal, and
a switch connected in-between the first gate terminal and the second gate terminal and configured to selectively couple the first gate terminal and the second gate terminal,
wherein the switch comprises a first further MOS transistor and a second further MOS transistor,
wherein a body terminal of the first further MOS transistor is coupled with the first source terminal,
wherein a body terminal of the second further MOS transistor is coupled with the second source terminal,
wherein an source terminal of the first further MOS transistor is coupled with the first gate terminal,
wherein a source terminal of the second further MOS transistor is coupled with the second gate terminal, and
wherein a drain terminal of the first further MOS transistor is coupled with a drain terminal of the second further MOS transistor.

9. The circuit of claim 1,
wherein the switch comprises a transmission gate.

10. The circuit of claim 1,
wherein the switch is controlled by at least one charge pump.

11. The circuit of claim 1,
wherein the first MOS power transistor and the second MOS power transistor are n-type,
wherein the switch comprises MOS transistors which are p-type.

12. A circuit, comprising:
a first MOS power transistor comprising a first gate terminal, a first drain terminal, and a first source terminal,
a second MOS power transistor comprising a second gate terminal, a second drain terminal, and a second source terminal, and
a switch connected in-between the first gate terminal and the second gate terminal and configured to selectively couple the first gate terminal and the second gate terminal,
wherein the first MOS power transistor and the second MOS power transistor are n-type,
wherein the switch comprises MOS transistors which are p-type,
wherein the at least one MOS transistor has a threshold voltage, and
wherein the threshold voltage of the at least one further MOS transistor is smaller than the threshold voltages of the first MOS power transistor and the second MOS power transistor.

13. A circuit, comprising:
a first MOS power transistor having a first gate terminal, a first drain terminal, and a first source terminal,
a second MOS power transistor having a second gate terminal, a second drain terminal, and a second source terminal, and a control circuitry configured to detect a failure condition of at least one of the first MOS power transistor and the second MOS power transistor, wherein the control circuitry is configured to provide a first control signal to the first gate terminal to operate the first MOS power transistor in a high-resistivity state and to provide a second control signal to the second gate terminal to operate the second MOS power transistor in a high-resistivity state, in response to said detecting of the failure condition.

14. The circuit of claim 13, wherein the control circuitry comprises a first sensor configured to detect the failure condition of the first MOS power transistor and to output a first sensor signal indicative of the detected failure condition of the first MOS power transistor, wherein the control circuitry comprises a second sensor configured to detect the failure condition of the second MOS power transistor and to output a second sensor signal indicative of the detected failure condition of the second MOS power transistor, wherein the control circuitry comprises an OR-logic element configured to output a combined sensor signal based on the first sensor signal and the second sensor signal, wherein the control circuitry is configured to determine the first control signal based on the combined sensor signal and to determine the second control signal based on the combined sensor signal.

15. The circuit of claim 14, wherein the control circuitry is configured to selectively determine the first control signal based on the combined sensor signal depending on an operating mode of the circuit, wherein the control circuitry is configured to selectively determine the second control signal based on the combined sensor signal depending on the operating mode of the circuit.

16. A method of operating a circuit that includes at least two MOS power transistors, wherein the circuit includes: a first MOS power transistor comprising a first gate terminal, a first drain terminal, and a first source terminal, a second MOS power transistor comprising a second gate terminal, a second drain terminal, and a second source terminal, a switch connected in-between the first gate terminal and the second gate terminal and configured to selectively couple the first gate terminal and the second gate terminal, a first clamp between the first drain terminal and the first gate terminal, the first clamp defining a first clamp voltage, and a second clamp between second drain terminal and the second gate terminal, the second clamp defining a second clamp voltage, wherein the second clamp voltage does not match the first clamp voltage, the method comprising: detecting a failure condition of at least one of the at least two MOS power transistors, and in response to said detecting of the failure condition: synchronizing the first and second gate terminals of the at least two MOS power transistors.

17. The method of claim 16, further comprising:

in response to said detecting of the failure condition: connecting the gate terminals of the at least two MOS power transistors.

18. The method of claim 17, further comprising:

selectively activating said connecting of the gate terminals depending on an operating mode of a circuit comprising the at least two MOS power transistors, wherein the operating mode is optionally indicated by at least one of a peripheral interface command and a control memory value.

19. The method of claim 16, further comprising:

in response to said detecting of the failure condition: operating a first MOS transistor in a low-resistivity state and operating a second MOS transistor in a low-resistivity state.

20. The method of claim 16, further comprising:

in response to said detecting of the failure: synchronizing gate drivers of the gate terminals of the at least two MOS power transistors.

* * * * *